(12) United States Patent
Hiranaka et al.

(10) Patent No.: US 7,282,255 B2
(45) Date of Patent: Oct. 16, 2007

(54) FLEXIBLE PRINTED CIRCUIT BOARD AND PROCESS FOR PRODUCING THE SAME

(75) Inventors: Kouichi Hiranaka, Matsuyama (JP); Ryuichi Nakagami, Ehime (JP); Mitsuhiro Fukuoka, Matsuyama (JP); Motohiro Yamashita, Matsuyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 218 days.

(21) Appl. No.: 10/516,576

(22) PCT Filed: Apr. 17, 2003

(86) PCT No.: PCT/JP03/04925

§ 371 (c)(1),
(2), (4) Date: Dec. 2, 2004

(87) PCT Pub. No.: WO03/105545

PCT Pub. Date: Dec. 18, 2003

(65) Prior Publication Data
US 2005/0174722 A1    Aug. 11, 2005

(30) Foreign Application Priority Data
Jun. 7, 2002    (JP) ............................. 2002-167632

(51) Int. Cl.
*B32B 3/00*    (2006.01)
(52) U.S. Cl. .................. 428/209; 428/675; 428/901
(58) Field of Classification Search .................. None
See application file for complete search history.

(56) References Cited

U.S. PATENT DOCUMENTS
5,372,848 A    12/1994  Blackwell et al.

FOREIGN PATENT DOCUMENTS

| JP | 54-129475 A | 10/1979 |
| JP | 01321687 A | 12/1989 |
| JP | 5-136548 A | 6/1993 |
| JP | 05136548 A | 6/1993 |
| JP | 5-230643 A | 9/1993 |
| JP | 08330728 A | 12/1996 |
| JP | 9-51163 A | 2/1997 |
| JP | 09051163 A | 2/1997 |
| JP | 2000-508265 A | 7/2000 |
| JP | 2001-151916 A | 6/2001 |
| JP | 2001151916 A | 6/2001 |
| WO | WO 97/38851 A1 | 10/1997 |

*Primary Examiner*—Jennifer McNeil
*Assistant Examiner*—Timothy M. Speer
(74) *Attorney, Agent, or Firm*—Akin Gump Strauss Hauer & Feld LLP

(57) ABSTRACT

The present invention relates to a flexible printed circuit board which has extremely high adhesion performance and on which very fine circuit patterns can be formed by etching, and to a method for producing the same. In the present invention, in the flexible printed circuit board wherein a copper thin film made of copper or an alloy containing primarily copper is directly formed on at least one side of a plastic film substrate, and copper is formed further on the copper thin film by the electrolytic plating method, the above-mentioned copper thin film has a two-layer structure in which a layer including at least a crystalline structure is formed on the surface side thereof, and the X-ray relative intensity ratio between crystal lattice plane indices (200)/(111) in the above-mentioned crystalline structure is 0.1 or less.

18 Claims, 16 Drawing Sheets

F I G. 3
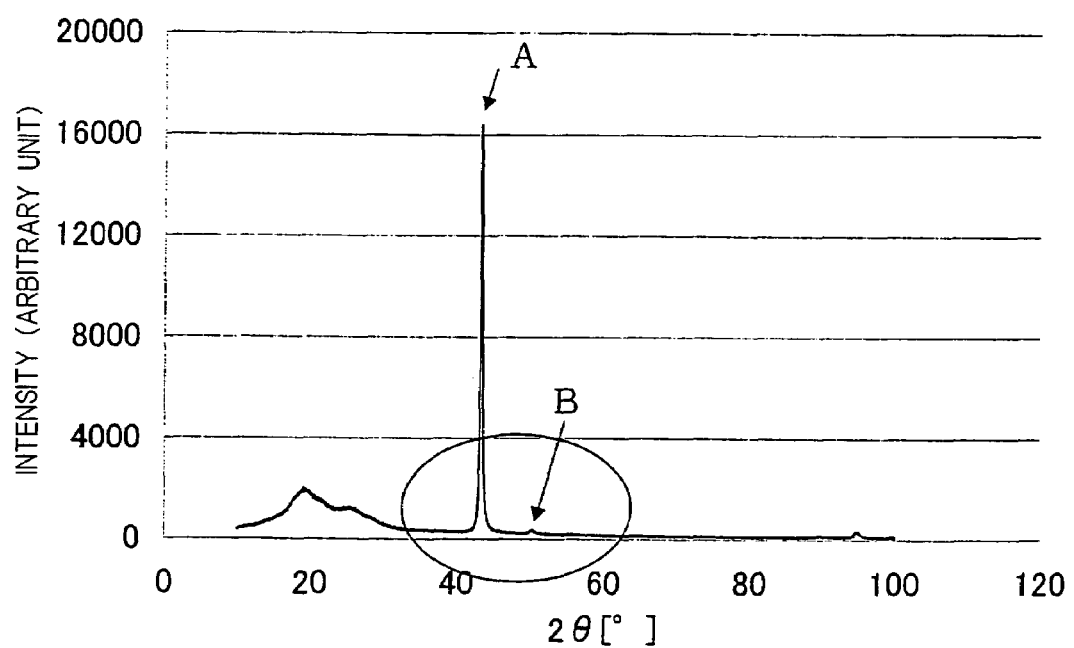

F I G. 1 3
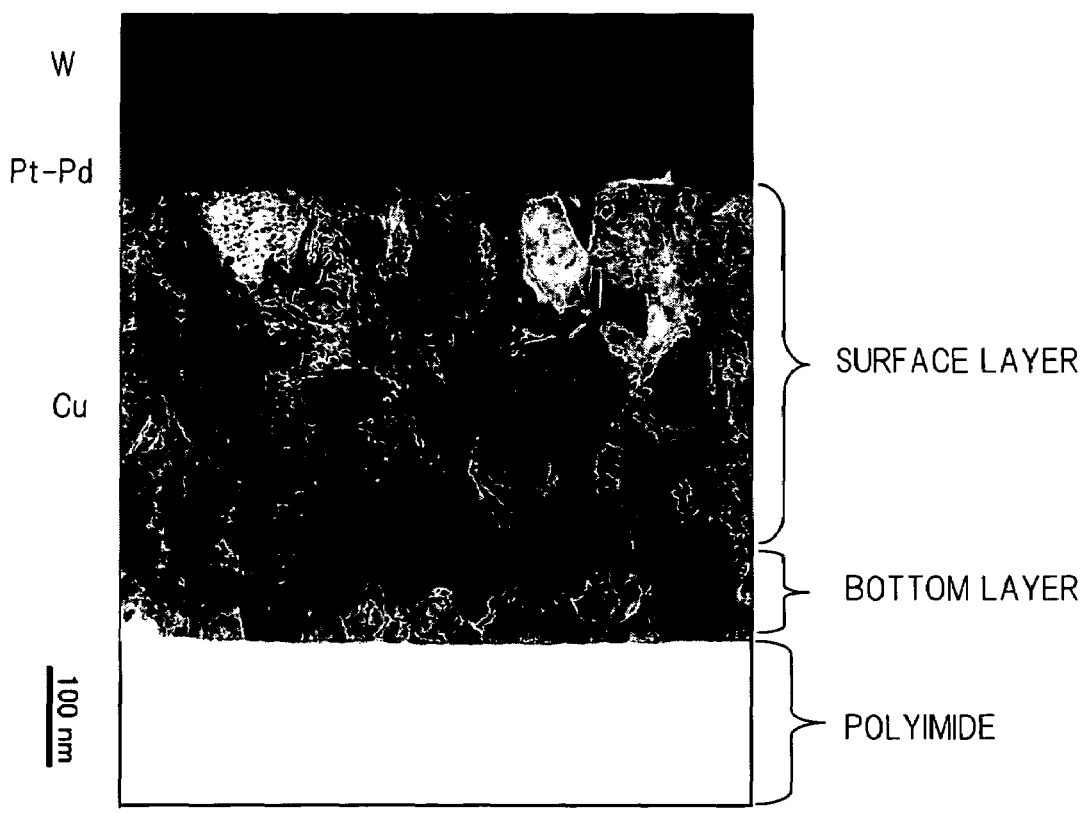

FIG. 14
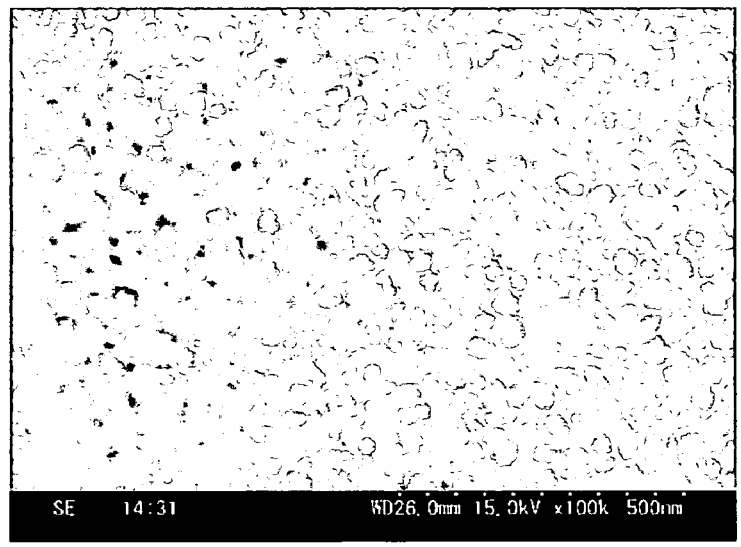
(a)
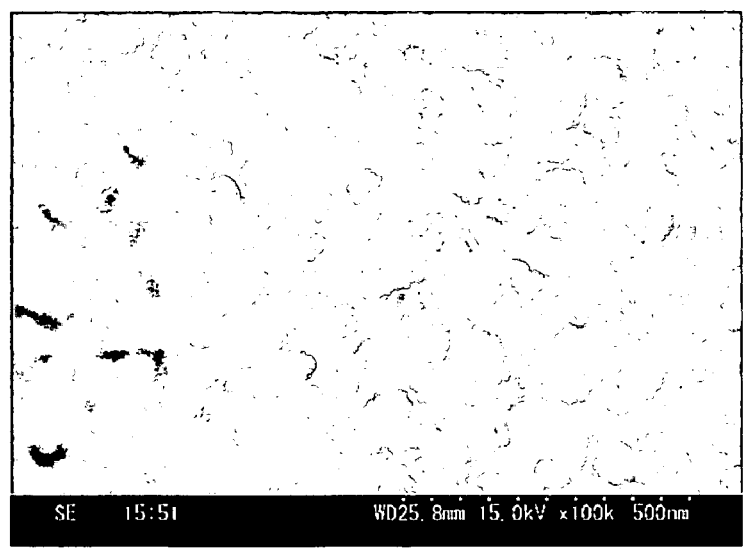
(b)

FLEXIBLE PRINTED CIRCUIT BOARD AND PROCESS FOR PRODUCING THE SAME

CROSS-REFERENCE TO RELATED APPLICATION

This application is a Section 371 of International Application No. PCT/JP03/04925, filed Apr. 17, 2003, which was published in the Japanese language on Dec. 18, 2003, under International Publication No. WO 03/105545 A1, the disclosure of which is incorporated herein by reference.

TECHNICAL FIELD

The present invention relates to a flexible printed circuit board for use in the electronic circuits of mobile phones, PDAs (personal digital assistants), notebook personal computers, digital still cameras, liquid crystal displays, etc., and to a method for producing the same.

BACKGROUND ART

At present, as a flexible copper-clad laminated sheet for use in mobile electronic apparatuses, a material obtained by bonding copper foil to the surface of a polyimide film or a polyester film with adhesive is a mainstream. In these years, mobile electronic apparatuses are made more compact, lightweight and highly functional, whereby flexible circuit boards having very fine circuit patterns and being excellent in high-frequency characteristics are demanded. For example, as the line space of very fine circuit patterns, a shape measuring 25 µm or less, for example, is demanded, and the demand for higher accuracy is also increasing to meet the need for bare chip mounting. In a conventional film obtained by bonding copper foil to a plastic film, the need for high-density thin-line design is satisfied by improving the heat resistance of adhesive and by making the copper foil thinner; however, the need for lightweight and highly functional design has not yet been satisfied sufficiently. In addition, the conventional film has problems to be solved, such as reduction in dimensional accuracy and reduction in electrical characteristics owing to the use of adhesive.

Furthermore, in a method for forming very fine circuit patterns having a thickness of 10 µm or less, the handling in a step of bonding the very fine circuit patterns to a film substrate is particularly difficult, thereby causing problems, such as the generation of creases and the adhesion of impurities.

As methods for directly forming a film of copper on a plastic film substrate to solve the above-mentioned problems in the conventional film, the vacuum evaporation method, sputtering method, ion plating method and copper plating method have been examined. These film forming methods have an effect of eliminating the above-mentioned defects owing to adhesive since there is no adhesive between the film substrate and the copper thin film and also has an effect of obtaining a printed circuit board excellent in electrical characteristics, such as electrical insulation and dielectric constant.

However, these film forming methods have problems; long time is required to form a necessary thickness of 5 to 10 µm, and the adhesion strength between the plastic film substrate and the copper thin film is insufficient.

Furthermore, a method for forming a copper thin film on a plastic film substrate by using the evaporation plating method has been examined. However, this evaporation plating method requires acid processing during plating processing, thereby causing a problem of delaminating an evaporated film during this acid processing.

A method for producing a conventional flexible printed circuit board will be described below briefly.

FIG. 15 is a cross-sectional view showing the configuration of a printed circuit board disclosed in the Official Gazette of Examined Japanese Patent Publication No. Sho 57-33718. As shown in FIG. 15, the Official Gazette of Examined Japanese Patent Publication No. Sho 57-33718 discloses a printed circuit board produced by evaporating a metal, such as nickel, cobalt or palladium, as an intermediate layer 12 on a plastic film substrate 11, and after the evaporation processing, by further evaporating a copper thin film 13. The peeling strength of the flexible printed circuit board has been improved by carrying out production in this way. However, in the case when the printed circuit board is left stationary in an environment of supersaturated steam of 120° C. at 2 atm after being subjected to electrolytic copper plating, there is a problem of being unable to maintain its desired peeling strength. In addition, in this production method, a step of forming a metal film serving as the intermediate layer 12 is necessary; for this purpose, etching processing and dewatering processing are required to be carried out, thereby having a problem of increasing cost.

The Official Gazette of Unexamined Japanese Patent Publication No. Hei 8-330728 proposes a method wherein chromium, an chromium alloy or the like is evaporated on a polyimide film containing 0.02 to 1 wt % of tin and then copper is evaporated thereon. However, this method has problems; insulation performance reduces since tin is present in the polyimide film, and etching efficiency lowers since an anchor evaporation layer for copper evaporation is required. Furthermore, this method also has problems to be solved; cost for forming a film of a chromium-based alloy and cost for dewatering processing are required, and environmental loads are large.

The specification of Japanese Patent Publication No. 2982851 (the Official Gazette of Unexamined Japanese Patent Publication No. Hei 6-228738) discloses a production method wherein copper sputtering is carried out in an atmosphere containing nitrogen at a volumetric ratio of approximately 0.09% to approximately 50% in order to improve the adhesion strength between a plastic film substrate and a copper thin film. However, the kinetic energy of the copper atom in sputtering is 5 eV at most (50 eV at a maximum), and the peeling strength has fluctuations depending on the surface state of the plastic film, thereby causing a problem of being unable to obtain a peeling strength of 1 kg/cm, the target of the product.

The Official Gazette of Unexamined Japanese Patent Publication No. Hei 5-251511 proposes a production method wherein after a rough face (microscopic irregularity) is formed by carrying out dry etching on the surface of a polyimide film using a mixture gas, such as oxygen, the rough face is subjected to discharge plasma processing using a gas containing nitrogen so as to generate functional groups having a strong bonding action with copper on the surface of the polyimide film. After the functional groups having the strong bonding action with copper are generated on the surface of the polyimide film, copper is evaporated on the surface to form a copper thin film. In this production method, it is certain that the peeling strength tends to be improved; however, the etching characteristics and the effect of the plasma processing varies depending on the surface state of the polyimide film. In other words, depending on the surface state of the polyimide film, the degree of the irregularity formed by the etching varies and the degree of the generation of the functional groups differs. Hence, in the polyimide flexible printed circuit board produced by the production method disclosed in the Official Gazette of Unexamined Japanese Patent Publication No. Hei 5-251511, the peeling strength of the copper thin film has fluctuations and does not satisfy a desired strength in some cases. In addition, in the disclosed production method, the plasma processing is carried out by using a reactive ion etching apparatus; however, in this kind of production method, the kinetic energy of ionized nitrogen plasma is 5 eV to 10 eV at most, whereby the generation of the functional groups is insufficient. Furthermore, since the kinetic energy in this production method is low, the generation of functional groups is greatly depending on the surface state of the plastic film, thereby causing a problem of being unable to securely generate functional groups on the plastic film.

In the thin-film production apparatus described in the specification of Japanese Patent Publication No. 890408 (the Official Gazette of Unexamined Japanese Patent Publication No. Sho 49-61031), a thin-film forming apparatus is used wherein high-frequency power is applied via a capacitor to a conductive substrate holder in which a substrate is installed and a substantially negative self-induced voltage is generated, whereby the peeling strength is improved. However, the specific conditions of forming a metal thin film on a plastic film, the relationship in peeling strength between the plastic film and the metal thin film and the relation between a film structure having high peeling strength and film-forming conditions are not disclosed in the Patent Publication No. 890408 at all.

The Official Gazette of Unexamined Japanese Patent Publication No. Hei 11-117060 discloses forming a modified polyimide layer by processing the surface layer of the polyimide film by using physical means, such as plasma or corona discharge, or by using chemical means, such as chemicals. This modified polyimide layer has a molecular structure comprising a carboxyl group generated when an imide ring is opened and at least one hydroxyl group attached to a benzene ring bound to the nitrogen of the imide ring and/or the nitrogen of the second amide generated when the imide ring is opened. In the technology disclosed in the Official Gazette of Unexamined Japanese Patent Publication No. Hei 11-117060, the modified polyimide layer formed is coated with a metal, such as copper, by a dry plating method, such as vacuum evaporation, sputtering and ion plating. However, the oxygen of the hydroxyl group changes the oxidation of copper from $Cu_2O$ to $CuO$ and degrades adhesion performance, thereby causing fluctuations in the peeling strength of the copper foil film.

The Official Gazette of Unexamined Japanese Patent Publication No. Sho 64-8264 discloses a film-forming method wherein metal grains, such as copper, having passed through the plasma of a mixture gas containing argon containing 0.01 to 10% of oxygen are attached to a plastic film subjected to plasma processing at low temperatures using oxygen gas. However, just as in the case of the technology disclosed in the above-mentioned Official Gazette of Unexamined Japanese Patent Publication No. Hei 11-117060, the oxygen of the hydroxyl group formed in the surface layer of the plastic film changes the oxidation of copper from $Cu_2O$ to $CuO$ and degrades adhesion performance, thereby causing fluctuations in the peeling strength of the copper foil film.

The Official Gazette of Unexamined Japanese Patent Publication No. Hei 11-92917 discloses reforming the surface of a polyimide film by plasma processing and forming a metal thin film, such as chromium, nickel or titanium on the reformed surface. In addition, it is informed that a copper film is taught by vacuum evaporation on the above-mentioned metal thin film and that electric copper plating is carried out further thereon. In the plasma reforming disclosed in the Official Gazette of Unexamined Japanese Patent Publication No. Hei 11-92917, the reformation is carried out so that the ratio (O/C) of the oxygen and carbon of the polyimide film is between 0.26 and 0.45. In this film-producing method, just as in the case of the technologies disclosed in the above-mentioned Official Gazette of Unexamined Japanese Patent Publication No. Hei 11-117060 and Official Gazette of Unexamined Japanese Patent Publication No. Sho 64-8264, the oxygen captured in the film changes the oxidation of copper from $Cu_2O$ to $CuO$ and degrades adhesion performance, thereby causing fluctuations in the peeling strength of the copper foil film.

The specification of U.S. Pat. No. 5,178,962 discloses a technology wherein the surface of a polyimide film is subjected to plasma processing by using an apparatus for generating electron cyclotron resonance plasma (Electron Cyclotron Resonance plasma generator: ECR plasma generator) to generate functional groups containing nitrogen, belonging to the carbonyl group, carboxyl group, amide group, amino group, imino group, imide group and cyano group, and to generate metal, while the degradation of the polyimide film is suppressed. In the technology disclosed in the specification of U.S. Pat. No. 5,178,962, the nitrogen concentration of polyimide increases after surface reformation using nitrogen or ammonia gas. However, since the kinetic energy is low, 50 eV or less, the oxygen concentration cannot be reduced by the ECR plasma processing. The oxygen of the surface layer of the polyimide film is a factor of degrading the reliability of a plastic film substrate on which copper is directly deposited. Furthermore, in the ECR plasma processing, the structure of the apparatus is limited so as to satisfy a cyclotron frequency of 2.45 GHz, and this ECR plasma processing apparatus and an evaporation apparatus are required to be arranged on one production line. Hence, problems are caused; the production apparatus becomes a large-scale apparatus, the surface reformation processing and the evaporation processing are long, complicated and high in cost.

The Official Gazette of Unexamined Japanese Patent Publication No. Hei 5-287500 discloses a circuit board production method wherein metal vapor is evaporated on a film, and the film is irradiated with nitrogen gas ions accelerated from an ion source simultaneously or alternately with the evaporation. According to this circuit board production method, the mixture layer of a metal element and nitrogen is formed at the interface between the metal layer and the polyimide, thereby improving adhesion performance. However, according to the circuit board production method disclosed in the Official Gazette of Unexamined Japanese Patent Publication No. Hei 5-287500, the acceleration voltage of the nitrogen ions is a high value of 5 KeV; hence, there is a fear of degradation of the polyimide owing to high-energy ions.

The Official Gazette of Unexamined Japanese Patent Publication No. 2001-151916 discloses a production method wherein a polyimide film containing aluminum oxide or silicon dioxide is subjected to plasma processing and a copper thin film is formed by the ion plating method using pressure gradient discharge. In the production method disclosed in the Official Gazette of Unexamined Japanese Patent Publication No. 2001-151916, when the copper thin film is formed by the ion plating method, the copper thin film is determined that the X-ray relative intensity ratio between crystal lattice plane indices (200)/(111) is 0.37 to 0.4. However, pattern defects occur in the case when aluminum oxide or silicon dioxide appears on very fine circuit patterns. In addition, crystals with crystal lattice plane indices (200) and (111) are mixed, numerous grain boundaries are generated between the two crystals, thereby causing a problem of degradation in chemical resistance. Furthermore, since the etching speed varies depending on crystal and grain boundary, there is a problem of varying the dimensional accuracy of the very fine circuit patterns.

An object of the present invention is to solve the problems in the above-mentioned various conventional technologies and to provide a technology for bonding a copper thin film made of copper or an alloy containing primarily copper to a plastic film firmly and directly.

In particular, an object of the present invention is to provide a flexible printed circuit board, at low cost, in which a copper thin film made of copper or an alloy containing primarily copper is directly bonded with adhesive to at least one side of a plastic film, which has very high adhesion performance and on which very fine circuit patterns can be formed by etching, wherein the interface structure between the plastic film and the copper thin film and the crystalline structure of a copper thin film to be grown subsequently are controlled so as to have desired structures by controlling the state of the plastic film substrate on which a film is formed and by optimizing the film-forming conditions of the copper thin film.

DISCLOSURE OF THE INVENTION

A flexible printed circuit board in accordance with the present invention is configured as described below to accomplish the above-mentioned object.

(1) The flexible printed circuit board in accordance with the present invention has a copper thin film made of copper or an alloy containing primarily copper and directly formed on at least one side of a plastic film substrate, wherein the above-mentioned copper thin film has a two-layer structure comprising a surface layer having at least a crystalline structure on the surface side of the above-mentioned copper thin film and a bottom layer formed between the surface layer and the above-mentioned plastic film substrate, and the X-ray relative intensity ratio between crystal lattice plane indices (200)/(111) in the crystalline structure of the above-mentioned surface layer is 0.1 or less.

(2) In the flexible printed circuit board in accordance with the present invention, it is preferable that the surface layer having the crystalline structure is composed of crystal grains having at least the crystal lattice plane index (111) and that the above-mentioned crystalline structure is a columnar structure.

(3) In the flexible printed circuit board in accordance with the present invention, it is preferable that the surface layer having the crystalline structure is composed of columnar crystal grains having at least the crystal lattice plane index (111) and that the above-mentioned crystal grains are formed into a cylindrical shape, a polygonal columnar shape or a shape of a mixture of these.

(4) In the flexible printed circuit board in accordance with the present invention, it is preferable that the surface layer having the crystalline structure is composed of columnar crystal grains having at least the crystal lattice plane index (111) and that the above-mentioned crystal grains are formed into a needle shape on the side of the bottom layer making contact with the plastic film substrate.

(5) In the flexible printed circuit board in accordance with the present invention, it is preferable that the columnar crystal grains having the crystal lattice plane index (111) and constituting the surface layer having the crystalline structure have a plane of the above-mentioned crystal lattice plane index (111) to be arranged according to preferred orientation in parallel to the surface of the plastic film.

(6) In the flexible printed circuit board in accordance with the present invention, it is preferable that the copper thin film made of copper or an alloy containing primarily copper on the plastic film substrate is composed of crystal grains having at least the crystal lattice plane index (111) and that the bottom layer made of a polycrystalline copper thin film is provided between the above-mentioned crystal grains and the above-mentioned plastic film substrate.

(7) In the flexible printed circuit board in accordance with the present invention, a copper thin film made of copper or an alloy containing primarily copper is directly formed on at least one side of a plastic film substrate, and copper is formed on the copper thin film by the electrolytic plating method, wherein the copper thin film made of copper or an alloy containing primarily copper on the above-mentioned plastic film substrate is composed of crystal grains having at least the crystal lattice plane index (111) and that the grain size of the short axis of the above-mentioned crystal grains is 20 nm to 100 nm.

(8) In the flexible printed circuit board in accordance with the present invention, it is preferable that the copper thin film made of copper or an alloy containing primarily copper on the plastic film substrate is composed of crystal grains having at least the crystal lattice plane index (111) and that the bottom layer made of a polycrystalline copper thin film is provided between the above-mentioned crystal grains and the above-mentioned plastic film substrate.

(9) In the flexible printed circuit board in accordance with the present invention, it is preferable that the copper thin film of the bottom layer made of copper or an alloy containing primarily copper and making contact with the plastic film substrate is configured so as to have a spherical structure.

(10) In the flexible printed circuit board in accordance with the present invention, it is preferable that a copper thin film made of copper or an alloy containing primarily copper is directly formed on at least one side of a plastic film substrate and that copper is formed on the copper thin film by the electrolytic plating method, wherein the copper thin film made of copper or an alloy containing primarily copper on the above-mentioned plastic film substrate has at least a two-layer structure, and the copper thin film of the bottom layer making contact with the plastic film substrate has a spherical structure, the copper thin film of the surface layer on the bottom layer has a columnar structure, and the diameter of the spherical structure of the bottom layer is made smaller than the grain size of the columnar structure of the surface layer.

(11) In the flexible printed circuit board in accordance with the present invention, a copper thin film made of copper or an alloy containing primarily copper is directly formed on at least one side of a plastic film substrate, and copper is formed on the copper thin film by the electrolytic plating method, wherein the fluctuation width of the irregular face on the boundary face between the plastic film substrate and the copper thin film made of copper or an alloy containing primarily copper is preferably in the range of 0.5 nm to 10 nm.

(12) In the flexible printed circuit board in accordance with the present invention, it is preferable that the copper thin film of the bottom layer made of copper or an alloy containing primarily copper and making contact with the plastic film substrate has polycrystals.

(13) In the flexible printed circuit board in accordance with the present invention, it is preferable that the copper thin film of the bottom layer made of copper or an alloy containing primarily copper and making contact with the plastic film substrate has a spherical structure having a diameter of 10 nm to 80 nm.

(14) In the flexible printed circuit board in accordance with the present invention, it is preferable that the copper thin film of the bottom layer made of copper or an alloy containing primarily copper and making contact with the plastic film substrate has a film thickness of 10 nm to 100 nm.

(15) In the flexible printed circuit board in accordance with the present invention, it is preferable that the copper thin film made of copper or an alloy containing primarily copper on the plastic film substrate has a film thickness of 100 nm to 500 nm.

(16) In the flexible printed circuit board in accordance with the present invention, it is preferable that the copper thin film of the surface layer is composed of crystal grains having the crystal lattice plane index (111).

(17) In the flexible printed circuit board in accordance with the present invention, it is preferable that the grain size of the short axis of the crystal grains having the crystal lattice plane index (111) and constituting the surface layer is 20 nm to 100 nm.

(18) In the flexible printed circuit board in accordance with the present invention, it is preferable that the copper thin film of the surface layer has a columnar structure being formed into a needle shape on the side of the bottom layer making contact with the plastic film substrate.

(19) In the flexible printed circuit board in accordance with the present invention, it is preferable that the copper thin film of the surface layer is formed into a cylindrical shape, a polygonal columnar shape or a shape of a mixture of these.

(20) In the flexible printed circuit board in accordance with the present invention, it is preferable that the plastic film substrate is made of at least one material selected from among polyimide film, Teflon (registered trademark) and liquid crystal polymer.

(21) It is preferable that the method for producing the flexible printed circuit board in accordance with the present invention comprises:

a step of subjecting a plastic film substrate to dewatering processing in vacuum, a step of introducing a mixture gas containing nitrogen in vacuum, a step of melting a metal of copper or an alloy containing primarily copper, a step of generating glow discharge by applying high-frequency power to the above-mentioned plastic film substrate by using stable discharging means, and an evaporation step of evaporating the above-mentioned metal to the above-mentioned plastic film substrate by ionizing the above-mentioned mixture gas and metal and by accelerating the above-mentioned ions by using a negative bias voltage induced by the glow discharge, wherein at least nitrogen and argon are introduced at the above-mentioned evaporation step.

(22) It is preferable that the method for producing the flexible printed circuit board in accordance with the present invention comprises:

a step of subjecting a plastic film substrate to dewatering processing in vacuum, a step of introducing a mixture gas containing at least nitrogen, generating glow discharge by applying high-frequency power to the above-mentioned plastic film substrate by using stable discharging means and ionizing the above-mentioned mixture gas, a step of subjecting the above-mentioned plastic film substrate to plasma processing by using the gas containing nitrogen ionized by the negative bias voltage induced in the above-mentioned plastic film substrate, a step of subsequently melting a metal of copper or an alloy containing primarily copper in vacuum, generating glow discharge by using a mixture gas containing argon and by applying high-frequency power to the above-mentioned plastic film substrate by using stable discharging means and ionizing the above-mentioned mixture gas and the metal of copper or an alloy containing primarily copper, and a step of evaporating a copper thin film onto the above-mentioned plastic film substrate by accelerating the above-mentioned ionized grains by using a negative bias voltage induced in the above-mentioned plastic film substrate.

(23) In the method for producing the flexible printed circuit board in accordance with the present invention, it is preferable that the step of subjecting the plastic film substrate to dewatering processing in vacuum includes a step of carrying out dewatering processing so that the partial pressure of moisture is $10^{-3}$ Pa or less.

(24) In the method for producing the flexible printed circuit board in accordance with the present invention, it is preferable at the step of carrying out the plasma processing by using the mixture gas containing at least nitrogen that the pressure is in the range of $10^{-3}$ Pa to $10^{-1}$ Pa and that the negative bias voltage induced in the above-mentioned plastic film substrate is 200 V to 1000 V.

(25) In the method for producing the flexible printed circuit board in accordance with the present invention, it is preferable at the step of carrying out the plasma processing by using the mixture gas containing at least nitrogen that the mixture gas contains nitrogen and an inert gas, the volumetric ratio of nitrogen in the entire gas being set at approximately 50% to approximately 100%.

(26) In the method for producing the flexible printed circuit board in accordance with the present invention, it is preferable at the step of evaporating the copper thin film on the plastic film substrate that the mixture gas containing nitrogen is a mixture gas containing nitrogen and an inert gas, the volumetric ratio of nitrogen in the entire gas being set at approximately 1% to approximately 20%.

(27) In the method for producing the flexible printed circuit board in accordance with the present invention, it is preferable at the step of evaporating the copper thin film on the plastic film substrate that the pressure is in the range of $10^{-3}$ Pa to $10^{-1}$ Pa and that the negative bias voltage induced in the above-mentioned plastic film substrate is 200 V to 1000 V.

(28) In the method for producing the flexible printed circuit board in accordance with the present invention, it is preferable at the step of evaporating the copper thin film on the plastic film substrate that a copper thin film having a film thickness of 10 nm to 100 nm is formed at an evaporation speed of 0.1 nm/sec to 0.5 nm/sec in the early stage of the evaporation and that film-forming is carried out subsequently at an evaporation speed of 0.5 nm/sec to 10 nm/sec so that the total film thickness of the copper thin film is 100 nm to 500 nm.

While the novel features of the invention are set forth particularly in the appended claims, the invention, both as to configuration and content, will be better understood and appreciated, along with other objects and features thereof, from the following detailed description taken in conjunction with the drawings.

BRIEF DESCRIPTION OF DRAWINGS

FIG. 3 is a graph showing an X-ray diffraction pattern of the copper thin film in the flexible printed circuit board in accordance with the present invention;

FIG. 13 is a micrograph obtained when the flexible printed circuit board produced by the production method in accordance with Comparative example 1 was photographed at a magnification of 190,000×;

Figure 15:
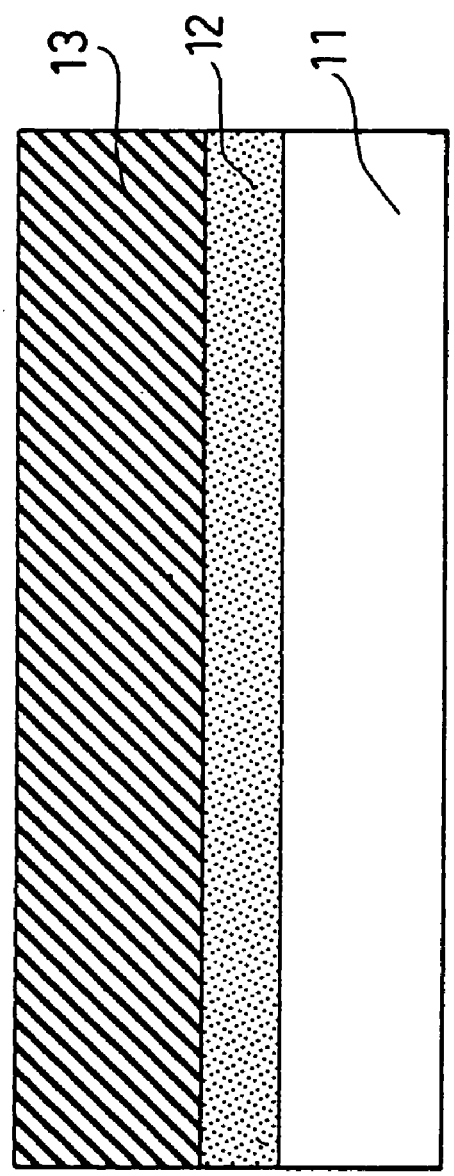
Figure 16:
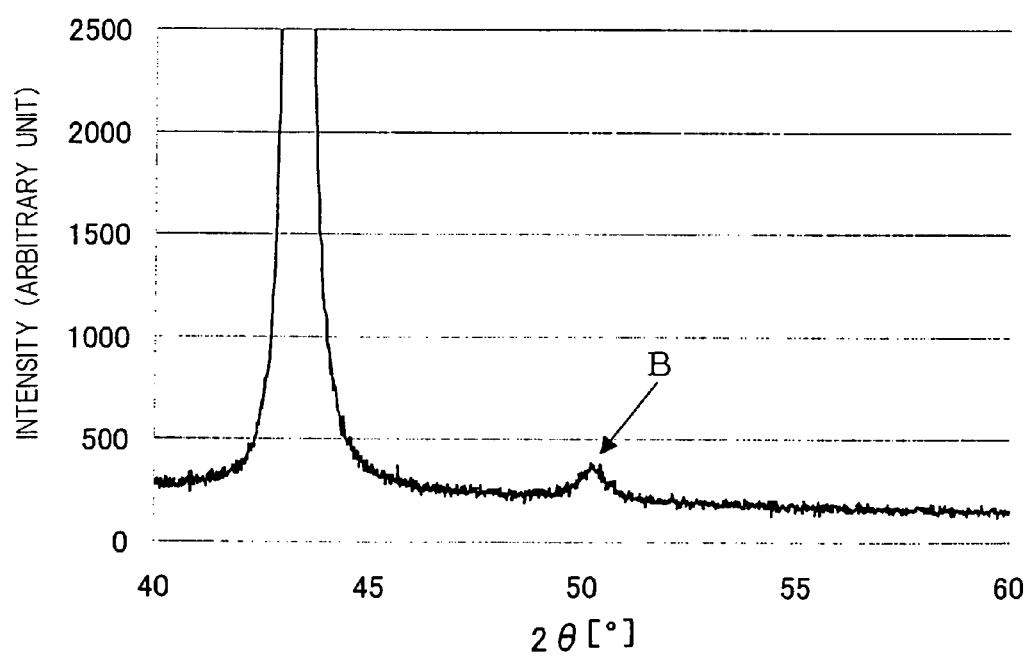

The upper micrograph in FIG. 14 is a photograph obtained when the copper thin film of the surface layer produced by the production method in accordance with Embodiment 1 was photographed with a scanning electron microscope (SEM) at a magnification of 100,000×, and the lower micrograph is a photograph obtained when the copper thin film of the surface layer produced by the production method in accordance with Comparative example 1 was photographed with a scanning electron microscope (SEM) at a magnification of 100,000×;

FIG. 15 is the cross-sectional view schematically showing the cross-section of the conventional flexible printed circuit board; and FIG. 16 is a graph showing, on an enlarged scale, a portion of the X-ray diffraction pattern of the copper thin film shown in FIG. 3.

It will be recognized that some or all of the figures are schematic representations for purposes of illustration and do not necessarily depict the actual relative sizes or locations of the elements shown.

BEST MODES FOR CARRYING OUT THE INVENTION

Figure 1:
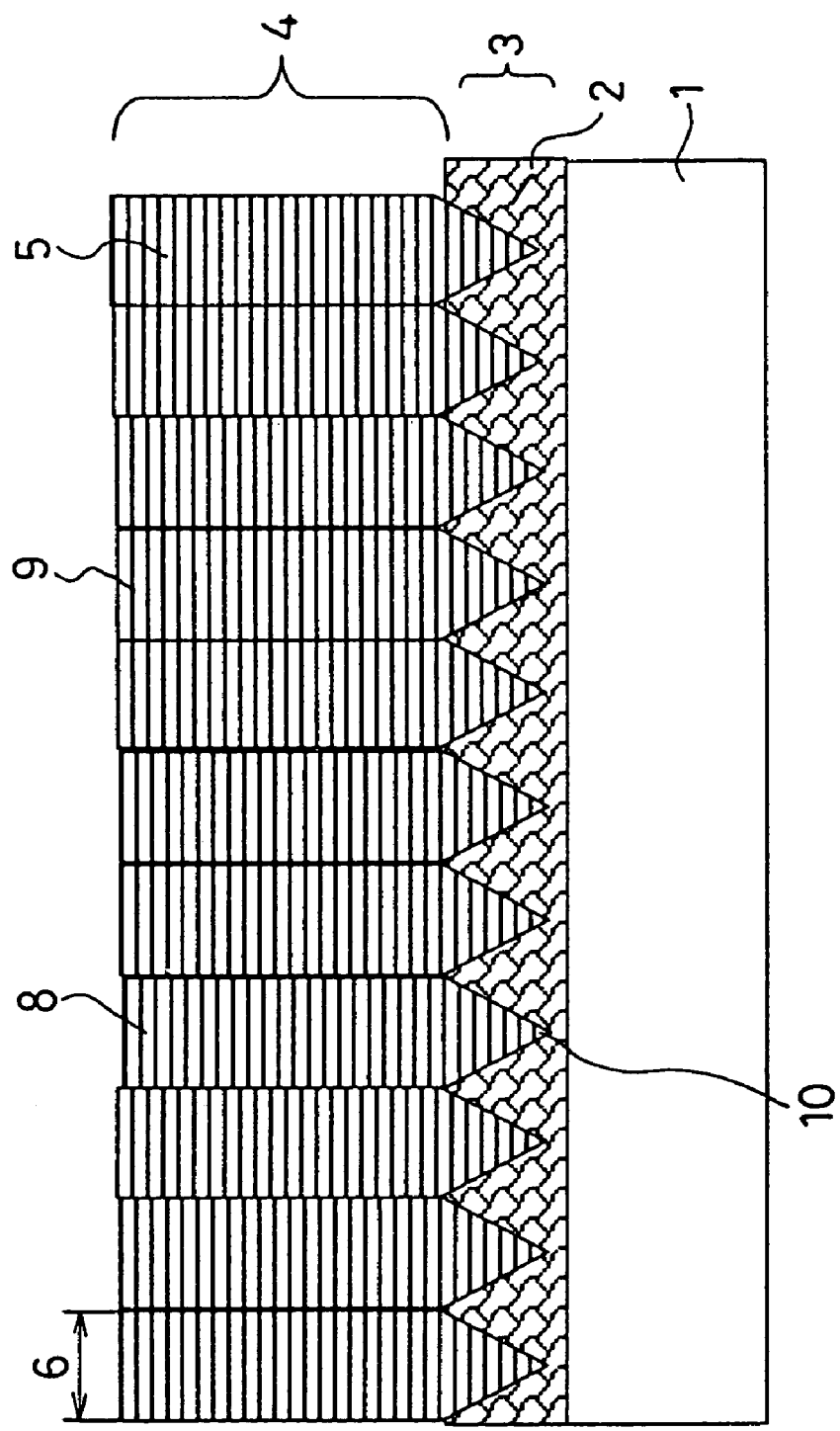
FIG. 1 is a cross-sectional view schematically showing the cross-sectional structure of a flexible printed circuit board in accordance with the present invention.

FIG. 1 is a cross-sectional view schematically showing the cross-sectional structure of a flexible printed circuit board in accordance with a preferred embodiment of the present invention. As shown in FIG. 1, in the flexible printed circuit board in accordance with the present invention, a bottom layer 3 composed of an aggregate of spherical polycrystals 2 of a copper alloy is formed on a plastic film substrate 1, and a surface layer 4 is laminated on this bottom layer 3. This surface layer 4 is composed of a columnar copper structure.

As the polyimide film to be used as the plastic film substrate 1 in the flexible printed circuit board in accordance with the present invention, films available on the market as product names, for example, registered trademark Kapton (Toray-DuPont Co., Ltd.), registered trademark Upilex (Ube Industries, Ltd.) and registered trademark Apical (Kanegafuchi Chemical Industry Co., Ltd.), can be used. In addition, as Teflon (registered trademark), films available on the market as product names, for example, Teflon (registered trademark) resin PTFE (polytetrafluoroethylene resin), Teflon (registered trademark) resin PFA (perfluoroalkoxy resin), Nafion (registered trademark) (these being produced by Dupont Corp. or Dupont-Mitsui Fluorochemicals Co., Ltd.) can be used. Other fluororesins, such as the copolymer of tetra fluoro ethylene and hexa fluoro propylene, polyvinyl fluoride and polyvinylidene fluoride, can also be used.

As liquid crystal polymer, films available on the market as product names, for example, registered trademark Vecstar (Kuraray Co., Ltd.) can be used.

First, a method for producing the flexible printed circuit board in accordance with the present invention will be described.

In the present invention, dewatering processing is carried out so that the amount of moisture generated from a plastic film has a partial pressure of $10^{-3}$ Pa or less in vacuum in consideration of the glass-transition temperature of the film for use in the flexible printed circuit board. This dewatering processing is carried out in consideration of the heat-resistant temperature of the flexible printed circuit board. As specific dewatering processing, heating processing for heating the plastic film substrate 1 is carried out, plasma processing is carried out by introducing an inert gas, or a method obtained by combining these processings is available. The combined method can carry out dewatering processing in a shorter time than the other methods.

The inventors have found that the moisture being present on the surface of the plastic film substrate 1 significantly influences the crystal state of the copper thin film growing on the plastic film substrate 1 in a step of forming the copper thin film.

Figure 2:
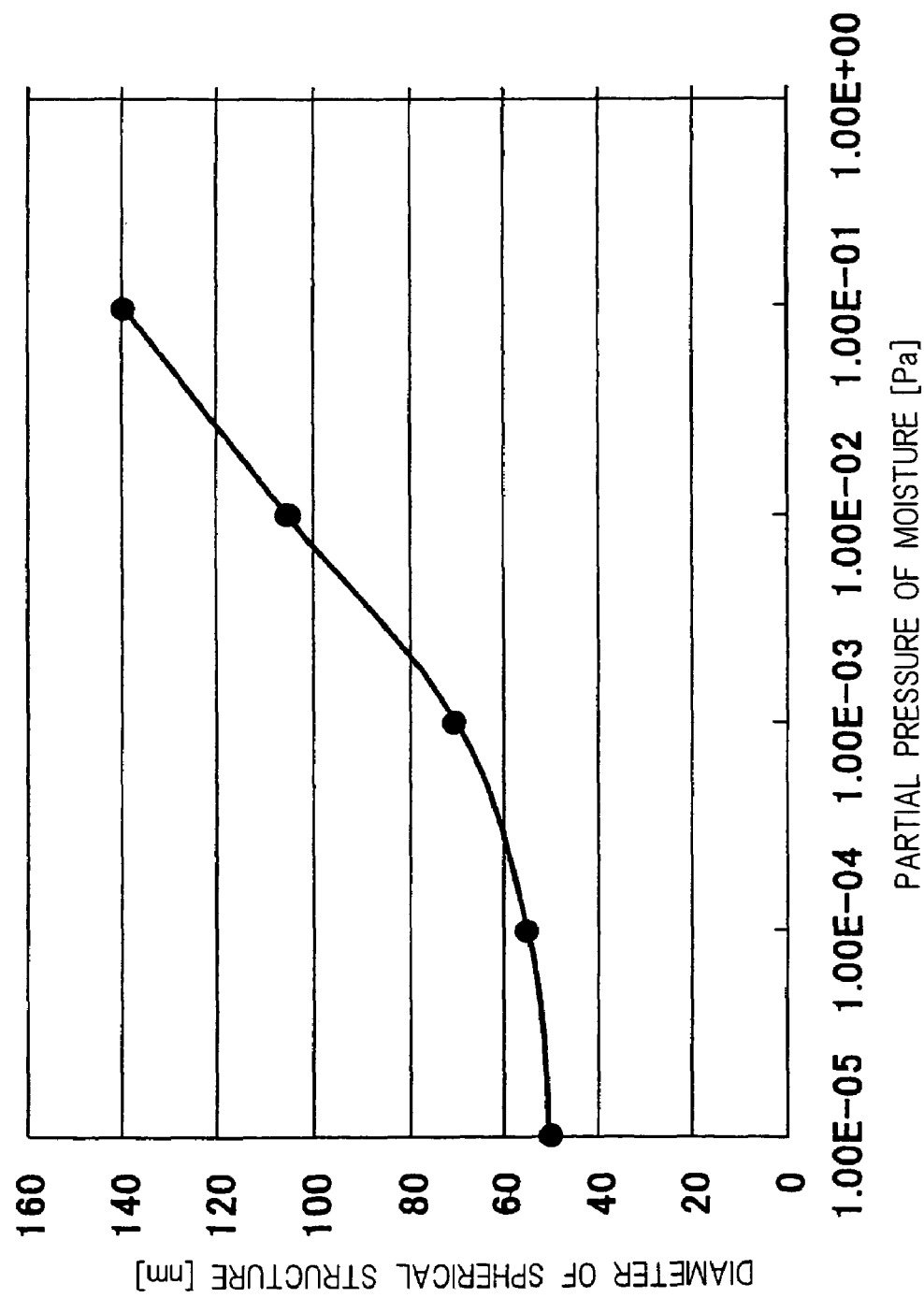
FIG. 2 is a graph showing the relationship between the diameter of grains of the bottom layer of a copper thin film and the partial pressure of moisture in the flexible printed circuit board in accordance with the present invention.

In the case when a copper thin film made of an alloy containing primarily copper is formed at a thickness of approximately 50 nm on the plastic film substrate 1 made of a polyimide film, FIG. 2 is a graph showing the relationship between the grain size (the diameter of grains) of the copper thin film and the partial pressure of moisture.

A specific production method for forming a copper thin film on a polyimide film serving as the plastic film substrate 1, carried out by the inventors to obtain the experimental result shown in FIG. 2, will be described below.

In order to form the copper thin film on the polyimide film, the inventors used a film-forming apparatus capable of substantially inducing a negative bias voltage in the polyimide film upon application of high-frequency power to a conductive substrate holder for holding the polyimide film by using stable discharging means. First, the plastic film substrate 1 made of a polyimide film was held in the conductive substrate holder and accommodated in the film-forming apparatus, and evacuation was carried out until an ultimate vacuum of $10^{-3}$ Pa or less was obtained. The partial pressure of moisture was measured with a quadrupole mass spectrometer. When a predetermined partial pressure of moisture was reached, a copper metal containing 99.99% copper was melted. In addition, an argon gas containing a nitrogen gas at a volumetric ratio of 5% was introduced, and the pressure inside the film-forming apparatus was set at $10^{-2}$ Pa.

Next, a high-frequency power of 300 W, having a frequency of 13.56 MHz, was applied to the conductive substrate holder for holding the plastic film substrate 1 by stable discharging means to generate glow discharge. In the state wherein glow discharge was generated in this way, a copper thin film of approximately 50 nm was formed on the plastic film substrate 1 at a film-forming speed of 0.2 nm/sec. The same conditions were used for all the film-forming conditions except for the partial pressure of moisture. The copper thin film obtained in this way on the plastic film substrate 1 was a copper thin film composed of spherical polycrystals. The surface state of the copper thin film on the polyimide film of the flexible printed circuit board produced by the above-mentioned production method was observed with a scanning electron microscope (SEM) of a magnification of 300,000×, and the diameter of the spherical polycrystalline structure constituting the copper thin film was measured.

As can be understood from the graph of FIG. 2, when the partial pressure of moisture reduces to a partial pressure of moisture of $10^{-}$Pa or less, the diameter of the spherical polycrystals becomes 80 nm or less; as the partial pressure of moisture reduces, the diameter reduces and tends to saturate. On the copper thin film of 50 nm formed as described above, a copper thin film of approximately 250 nm was then laminated on the polyimide film while the copper-film-forming speed was varied from 0.5 nm/sec to 10 nm/sec, and then, this copper thin film was coated with electroplated copper having a thickness of 20 μm. When the copper thin film laminated on this polyimide film was subjected to the 180° peeling test conforming to JIS C6481 (180 degrees peeling), it was found that the peeling strength increased as the diameter decreased and that a strength of 1 kg/cm, a value nearly equal to the target of the product, was obtained at a diameter of 80 nm or less. Similar experiments were also conducted for other plastic films, such as liquid crystal polymer and fluororesin, and a similar tendency was obtained. Moisture is not only contained in or attached to the plastic film, but also supplied from a jig or a reaction vessel in some cases; in any case, it is preferable that the partial pressure of moisture is $10^{-3}$ Pa or less in the film-forming apparatus immediately before film forming, and it is further preferable that the partial pressure of moisture is $10^{-4}$ Pa or less to accomplish the peeling strength more stably.

After the dewatering processing was carried out at a partial pressure of moisture of $10^{-3}$ Pa or less as described above, a mixture gas containing nitrogen is introduced into vacuum, the degree of vacuum is set at $10^{-3}$ Pa to $10^{-1}$ Pa, and a metal of copper or an alloy containing primarily copper is melted. As the metal of copper or an alloy containing primarily copper, an alloy containing 99.99% or more of copper in total weight ratio is preferably used. As the mixture gas containing nitrogen, an inert gas containing nitrogen at a volumetric ratio of approximately 1% to 20% can be used. As the inert gas, argon, xenon or krypton is available, and argon is preferably used.

Next, high-frequency power is applied to the conductive substrate holder for holding the plastic film substrate 1 by the stable discharging means to generate glow discharge. Herein, as the stable discharging means, for example, a commercially available high-frequency matching device comprising a variable capacitor, a variable resistor or a variable choke coil can be used. In the case when the frequency to be used at this time is low, a sufficient bias is not obtained. On the other hand, in the case of high frequency, its handling is difficult. Usually, a commercially available frequency band of 5 MHz to 100 MHz can be used. In the experiments by the inventors, an industrial frequency band of 13.56 MHz was used as high-frequency power source. Power of 150 W to 1 KW is suitble for the power to be applied. A capacitor is substantially formed between the line of a high-frequency introduction cable 30 and an insulation support section inside a vacuum apparatus by applying the high-frequency power to the conductive substrate holder for holding the plastic film substrate 1 by using the stable discharging means. Hence, stable glow discharge is obtained, and a negative self-induced electromotive voltage is generated in the conductive substrate holder. At this time, a negative self-induced bias voltage of 200 V to 1000 V can be generated at the conductive substrate holder by the above-mentioned power applied.

Hence, it is assumed that an almost substantially negative self-induced voltage is applied to the plastic film substrate 1 adjacent to the conductive substrate holder. During the above-mentioned glow discharge generation, a mixture gas containing metal and nitrogen is excited or dissociated or ionized, whereby abstraction reactions and/or substitution reactions occur at the constituent atoms of the plastic film substrate 1. The metal ionized together with the above-mentioned abstraction reactions and/or substitution reactions collides with the plastic film substrate 1 while having a high kinetic energy of 200 eV to 1000 eV depending on the high-frequency power, thereby being deposited on the plastic film substrate 1.

Next, another method for producing the flexible printed circuit board in accordance with the present invention will be described.

In the other production method for forming the copper thin film on the plastic film substrate 1 made of a polyimide film, before the step of forming the copper thin film on the plastic film substrate 1, a mixture gas containing at least nitrogen is introduced, and high-frequency power is applied to the conductive substrate holder for holding the plastic film substrate 1 by the stable discharging means. By the application of the high-frequency power, a mixture gas containing nitrogen is excited or dissociated or ionized, and the plastic film substrate 1 is subjected to plasma processing.

More specifically, a mixture gas containing nitrogen at a volumetric ratio of approximately 50% to approximately 100% is used, and a high-frequency power of 150 W to 1 KW, having a frequency of 13.56 MHz, is applied at a vacuum of $10^{-3}$ Pa to $10^{-1}$ Pa. In this state, glow discharge occurs, and a negative self-induced bias voltage of approximately 200 V to approximately 1000 V is generated in the vicinity of the plastic film substrate 1. Under this glow discharge, the mixture gas containing nitrogen is excited or dissociated or ionized, whereby abstraction reactions and/or substitution reactions occur at the atoms constituting the plastic film substrate 1. In particular, the mixture gas containing the ionized nitrogen collides with the plastic film substrate 1 while having a high kinetic energy of 200 eV to 1000 eV depending on the high-frequency power. As a result, in the plastic film substrate 1, not only the bond between carbon and hydrogen is broken, but also the bond between carbon and carbon and the bond between carbon and oxygen are broken, whereby high-density cyano functional groups are formed on the plastic film substrate 1. As a gas to be added to nitrogen, an inert gas, such as argon, xenon or krypton, is available, and argon is preferably used.

Then, a metal of copper or an alloy containing primarily copper is melted. As the metal of copper or an alloy containing primarily copper, an alloy containing 99.99% or more of copper in total weight ratio is used preferably. Next, the mixture gas containing argon is introduced, and high-frequency power is applied to the plastic film substrate 1 by the stable discharging means at a vacuum in the range of $10^{-3}$ Pa to $10^{-1}$ Pa. By the application of the high-frequency power, glow discharge is generated. A frequency of 13.56 MHz is used as the frequency of the high-frequency power, and a power of 150 W to 1 KW is appropriate as the power to be applied. By the application of the high-frequency power to the plastic film substrate 1 by using the stable discharging means, a negative self-induced bias voltage of 200 V to 1000 V is generated in the vicinity of the plastic film substrate 1, just as in the case of nitrogen and argon.

In the above-mentioned plasma atmosphere, the metal of copper or an alloy containing primarily copper is excited together with the mixture gas or dissociated or ionized. The ionized metal or mixture gas is accelerated by a bias voltage and reaches the plastic film substrate 1. At this time, the metal ions are bound covalently to the cyano functional group serving as a nitrogen functional group and having been formed on the plastic film substrate 1 by the above-mentioned plasma processing. On the other hand, the metal excited or dissociated reaches the upper side of the plastic film substrate 1, together with the mixture gas, and binds covalently to the cyano functional group serving as a nitrogen functional group and having been formed on the plastic film substrate 1 by the plasma processing.

In the production method in accordance with the present invention, high-density covalent bonds to the constituent atoms of the plastic film substrate 1 are formed via nitrogen, whereby the adhesion performance between the plastic film substrate 1 and the metal can be improved significantly. Then, a metal film is formed on the plastic film substrate 1, whereby the metal of copper or an alloy containing primarily copper binds to the metal bound to the cyano functional group. As a result, the spherical polycrystals grow, and further grow to columnar crystals.

In both the film-forming step wherein the mixture gas containing nitrogen is used and the film-forming step wherein the mixture gas containing argon is used to evaporate the copper thin film on the plastic film substrate 1, the speed of the film-forming is controlled by controlling the current flowing in a tungsten board for melting the metal of copper or an alloy containing primarily copper in the resistance heating method or by controlling the current flowing in an emitter in the electron beam evaporation method. In this film-forming step, the evaporation speed of the copper or the alloy containing primarily copper is set at 0.1 nm/sec to 0.5 nm/sec, and the copper thin film of the bottom layer 3 making contact with the plastic film substrate 1 is formed at a film thickness of 10 nm to 100 nm. Then, subsequently, the current is increased, and a copper thin film serving as the surface layer 4 is formed at a film-forming speed of 0.5 nm/sec to 10 nm/sec.

The film-forming is carried out so that the total film thickness of the bottom layer 3 making contact with the plastic film substrate 1 and the surface layer 4 formed thereon becomes 100 nm to 500 nm. The film-forming speed at the evaporation time of the bottom layer 3 relates to the structure of the copper thin film constituting the bottom layer 3.

When the film-forming speed of the bottom layer 3 exceeds 0.5 nm/sec, the migration of metal atoms on the surface of the plastic film substrate becomes dominant over the covalent bonds of the metal and the cyano functional groups on the plastic film substrate 1, whereby the covalent bond being effective in adhesion performance become insufficient. Hence, the diameter of the grains constituting the bottom layer 3 becomes larger, and the diameter of the grains of the copper alloy of the surface layer 4 of the copper thin film to be formed subsequently also becomes larger. As a result, the peeling strength between the plastic film substrate 1 and the copper thin film becomes lower. In addition, the flexible printed circuit board formed in this way becomes low in chemical resistance and dimensional accuracy at the time of etching.

On the other hand, when the film-forming speed of the bottom layer 3 is less than 0.1 nm/sec, a problem of low productivity occurs. Therefore, it is preferable that the evaporation speed of the bottom layer 3 of the copper thin film is 0.1 nm/sec to 0.5 nm/sec. In this condition, the copper thin film of the bottom layer 3 is composed of spherical polycrystals, and the diameter of the spherical polycrystals is 10 nm to 80 nm. Furthermore, the surface layer 4 of the copper thin film subsequently growing on the bottom layer 3 formed in this condition is composed of a uniform and dense columnar crystalline structure.

FIG. 3 is an X-ray diffraction pattern of the copper thin film formed on the plastic film substrate 1 and obtained by the above-mentioned production method in accordance with the present invention. FIG. 16 is a graph showing, on an enlarged scale, the portion circled in the X-ray diffraction pattern of the copper thin film shown in FIG. 3. By observation of the X-ray diffraction patterns of FIG. 3 and FIG. 16, the main peak (the peak indicated by reference letter A in FIG. 3) of the crystal lattice plane index (111) is found at 2θ equals to 43° to 44°, and the sub-peak (the peak indicated by reference letter B in FIG. 3) of the crystal lattice plane index (200) is found at 2θ equals to 50° to 51°.

Flexible printed circuit boards were formed in various film-forming conditions, and the X-ray relative intensity ratio between the peak intensity of the crystal lattice plane index (200) and the peak intensity of the crystal lattice plane index (111), that is, (200)/(111), and the peeling strength of the copper thin film were examined for the respective flexible printed circuit boards. As a result, the inventors have found that the peeling strength increases as the X-ray relative intensity ratio (200)/(111) decreases. The measurement of the peeling strength was carried out in conformity with the measurement method of JIS C6481 (180 degrees peeling) in a state wherein the flexible printed circuit board produced as described above was coated with copper plating having a thickness of approximately 20 μm by electroplating.

Figure 4:
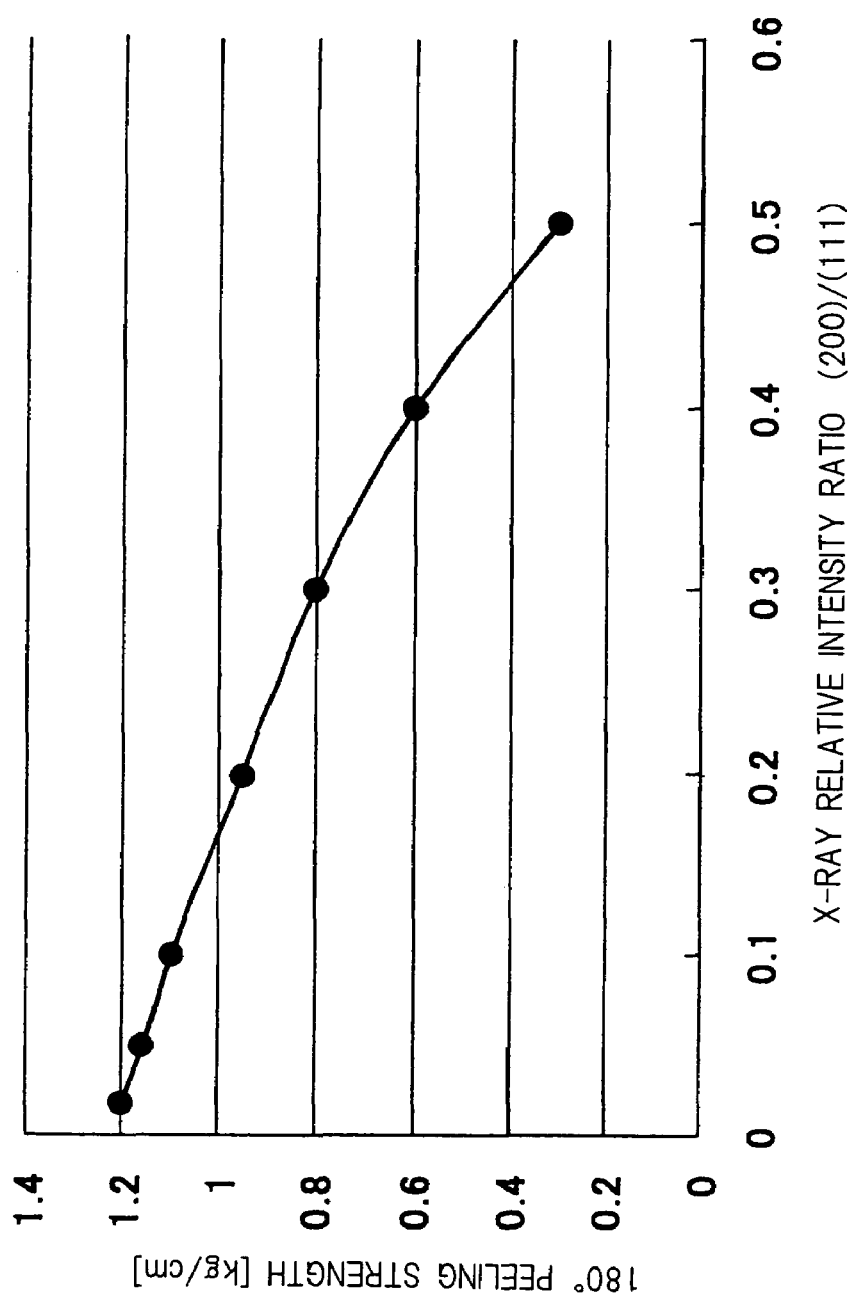
FIG. 4 is a graph showing the relationship between the X-ray relative intensity ratio (200)/(111) and the 180° peeling strength in the flexible printed circuit board in accordance with the present invention.

FIG. 4 is a graph showing the relationship between the X-ray relative intensity ratio (200)/(111) and the 180° peeling strength [kg/cm]. As shown in the graph of FIG. 4, it has been found that the 180° peeling strength increases as the X-ray relative intensity ratio (200)/(111) decreases and that a peeling strength of 1 kg/cm or more is obtained when the X-ray relative intensity ratio (200)/(111) equals to 0.1 or less in particular. This is because the copper crystals of the crystal lattice plane index (111) grow along the preferred orientation. This kind of structure is a close-packed structure, and the fact that the X-ray relative intensity ratio (200)/(111) is 0.1 or less means that 90% or more of the copper thin film of the surface layer 4 is uniformly composed of the crystals of the crystal lattice plane index (111). As the diameter of the grains is smaller, the crystals of the crystal lattice plane index (111), having a close-packed structure, are formed at higher density, and the electron clouds of the copper atoms sufficiently overlap with one another, whereby a copper thin film excellent in chemical resistance can be accomplished. Therefore, the copper thin film having this kind of close-packed structure is improved in the uniformity of etching, and the dimensional accuracy of very fine circuit patterns can be improved.

When the cross-sectional structure of the flexible printed circuit board produced by the production method in accordance with the present invention was observed with a transmission electron microscope of a magnification of 1,220,000×, it was found that the crystalline structure of the copper thin film having the close-packed structure had a columnar structure wherein the long axis of the crystal grain is perpendicular to the surface of the plastic film.

Figure 5:
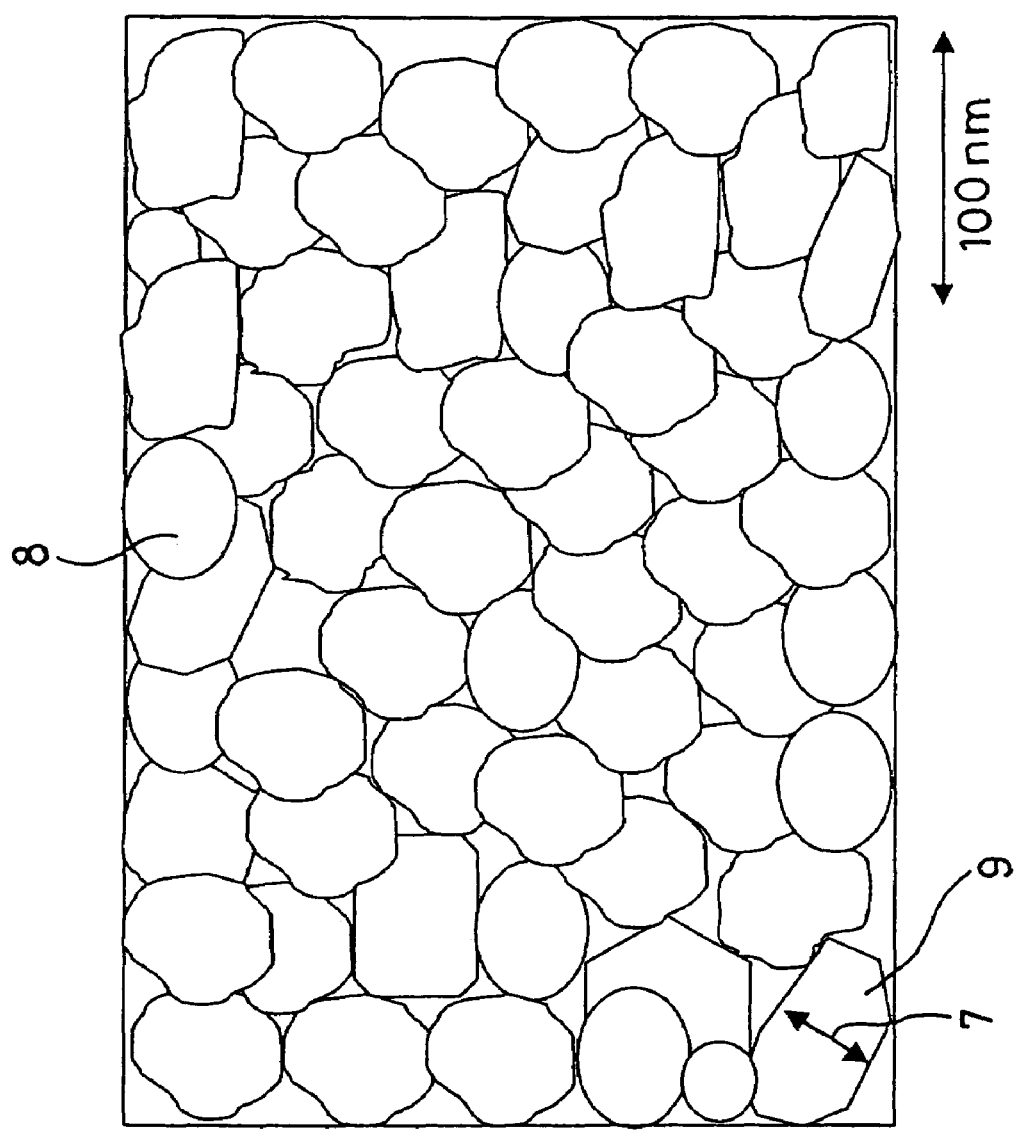
FIG. 5 is a plan view schematically showing the surface state of the surface layer of a copper thin film in the flexible printed circuit board in accordance with the present invention.

FIG. 5 schematically shows the surface structure of the flexible printed circuit board in accordance with the present invention, obtained by observation with a scanning electron microscope. In the above-mentioned FIG. 1, reference numeral 2 designates the spherical polycrystals of the copper alloy, and the aggregate of the spherical polycrystals 2 forms the bottom layer 3. The surface layer 4 is composed of a columnar copper crystalline structure 5. When it is assumed that the grain size 6 the columnar crystalline structure in the surface layer 4 is the short-axis diameter of the grains of the columnar crystalline structure as shown in FIG. 1, this grain size 6 corresponds to the grain size 7 indicated in the surface structure observed with the scanning electron microscope and shown in FIG. 5.

As shown in FIG. 5, when the surface structure of the copper thin film of the flexible printed circuit board produced by the production method in accordance with the present invention was observed with a scanning electron microscope (SEM) of a magnification of 300,000×, it was found that the cross-sectional shape of the short-axis diameter side (in the direction of the plane substantially parallel to the surface of the plastic film substrate 1) of the grains in the columnar crystalline structure is, for example, a cylindrical crystal 8, a polygonal columnar crystal 9 or a crystal having a shape of a mixture of these.

When the vertical cross-section of the flexible printed circuit board produced by the production method in accordance with the present invention was carefully observed with a transmission electron microscope, it was found that the columnar crystal grains of the crystal lattice plane index (111), constituting the surface layer 4 having a crystalline structure, have a needle shape 10 on the side of the copper thin film of the bottom layer 3 making contact with the plastic film substrate 1 as shown in the schematic view of FIG. 1.

In the crystalline structure of the layer configuration of the flexible printed circuit board produced by the production method in accordance with the present invention, it was found that in the columnar crystal grain having the crystal lattice plane index (111), the faces of the crystal lattice plane index (111) are arranged according to preferred orientation in parallel to the surface of the plastic film substrate. This coincides with the fact that in the cross-sectional structure of the flexible printed circuit board, obtained by observation with the transmission electron microscope, the columnar structure of the copper is formed so as to stand perpendicular to the surface of the plastic film substrate 1.

Furthermore, as shown in FIG. 1, it was found that in the copper thin film made of the copper or the alloy containing primarily copper and formed on the plastic film substrate 1, the bottom layer 3 composed of polycrystals is formed between the plastic film substrate 1 and the crystal grains. The bottom layer 3 of the copper thin film composed of the polycrystals relieves the lattices of the plastic film substrate 1 and the copper thin film, and acts as a crystal nucleus (precursor) of the crystal grains 5 when the surface layer 4 of the copper thin film grows.

Next, the reason why the thin film of the flexible printed circuit board produced by the production method in accordance with the present invention can have adhesion strength higher than that of the conventional production method will be described.

The strength of adhesion between the plastic film substrate 1 and the thin film formed thereon is greatly dependent on the state of physical linkage such as the anchor effect and the state of chemical bonds of atoms. In the case when the types of the plastic film substrates 1 are the same, the surface state of the plastic film substrate 1 and the energy at the time of collision of grains significantly influence the peeling strength of the copper thin film. When the grain energy levels in various evaporation methods are compared, the thermal kinetic energy in the vacuum evaporation method is approximately 0.5 eV, and the energy in the cathode sputtering evaporation method, a conventional production method, is approximately 5 eV (50 eV at a maximum).

In the production method in accordance with the present invention, the energy of ionized grains can be controlled as desired by the high-frequency power applied to the conductive substrate holder disposed in the vicinity of the plastic film substrate 1. By the application of the high-frequency power in the range of 150 W to 1000 W to the conductive substrate holder, the energy of ionized grains can be raised to high energy of approximately 200 eV to 1000 eV. Furthermore, in the production method in accordance with the present invention, since the vacuum is higher by one order of magnitude or more than that of the ordinary sputtering, the method is characterized in that the average free path of grains is long and that the density of the ionized grains is high. As described above, in the production method in accordance with the present invention, the ionized grains have high energy and have high grain density. Furthermore, in the case when excited or dissociated grains are present, and when the grains enter the space among the atoms in the plastic film substrate 1, a sputtering phenomenon occurs wherein atoms having weak bonding strength in the plastic film substrate 1 are forced out. Furthermore, at this time, metal is deposited on the plastic film substrate 1 while the substitution reactions and/or abstraction reactions for the atoms constituting the plastic film substrate 1 are carried out very forcefully. As a result, according to the production method in accordance with the present invention, firm films can be formed securely in the flexible printed circuit board.

Next, the effects of the method for producing the flexible printed circuit board depending on the difference in the plasma-generating gas will be described.

In the case when oxygen is used as a plasma-generating gas, oxygen radicals (oxygen groups) break the hydrogen bonds of a polymer, and functional groups, such as a carboxyl group and a hydroxyl group, are generated. In the case when copper serving as a wiring material is evaporated on a substrate of a polymer material, the copper is bound to the functional groups, such as a carboxyl group and a hydroxyl group, and temporarily becomes monovalent copper ions, $Cu_2O$, whereby the adhesion performance is improved. However, the copper becomes bivalent copper ions, CuO, in due time, whereby the adhesion performance is degraded. Hence, it is preferable that oxygen that may cause the degradation is not present in the interface between the substrate of the polymer material and the copper.

In the case when the mixture gas containing nitrogen is used in the production method in accordance with the present invention, the mixture gas containing nitrogen is excited or dissociated or ionized by the high-frequency power. The excited or dissociated or ionized mixture gas containing nitrogen cuts off hydrogen from the bond between carbon and hydrogen, carbon from the bond between carbon and carbon, and oxygen from the bond between carbon and oxygen on the surface of the plastic film substrate 1 and in the vicinity of the surface by virtue of substitution reactions and abstraction reactions. As a result, in the plastic film substrate 1, nitrogen radicals and/or nitrogen ions enter the polymer and are bound to the carbons cut off from the bonds by virtue of the substitution reactions and the abstraction reactions, whereby cyano functional groups are generated.

Therefore, in the case when the mixture gas containing nitrogen is used for the production of the flexible printed circuit board, the density of the functional groups of the plastic film can be made significantly higher than that in the case when the conventional plasma-generating gas based on argon is used. It is thus possible to further increase the surface density of the cyano functional groups and to increase the number of chemical bonds between the atoms and the metal constituting the plastic film by replacing argon or oxygen with nitrogen and by changing the plasma excited species as described above. Therefore, the bottom layer 3 of the copper thin film, having bonding strength higher than that in the sputtering evaporation method, can be formed. The surface density of the functional groups is reflected to the diameter of the spherical polycrystals 2 having the spherical structure of the polycrystalline copper thin film constituting the bottom layer 3.

The bottom layer 3 of the copper thin film formed by the above-mentioned production method in accordance with the present invention has a function of becoming the crystal nucleus (precursor) of the copper crystals constituting the surface layer 4. In the formation of the surface layer 4, the copper grows in the boundaries of the spherical polycrystals 2 or in the boundaries on the side of the bottom layer 3 composed of other polycrystals or a mixture of these, and the columnar crystal grains 5 being formed into the needle shape 10 in due time are formed. The aggregate of the crystal grains 5 formed in this way becomes the surface layer 4 of the copper thin film.

Figure 6:
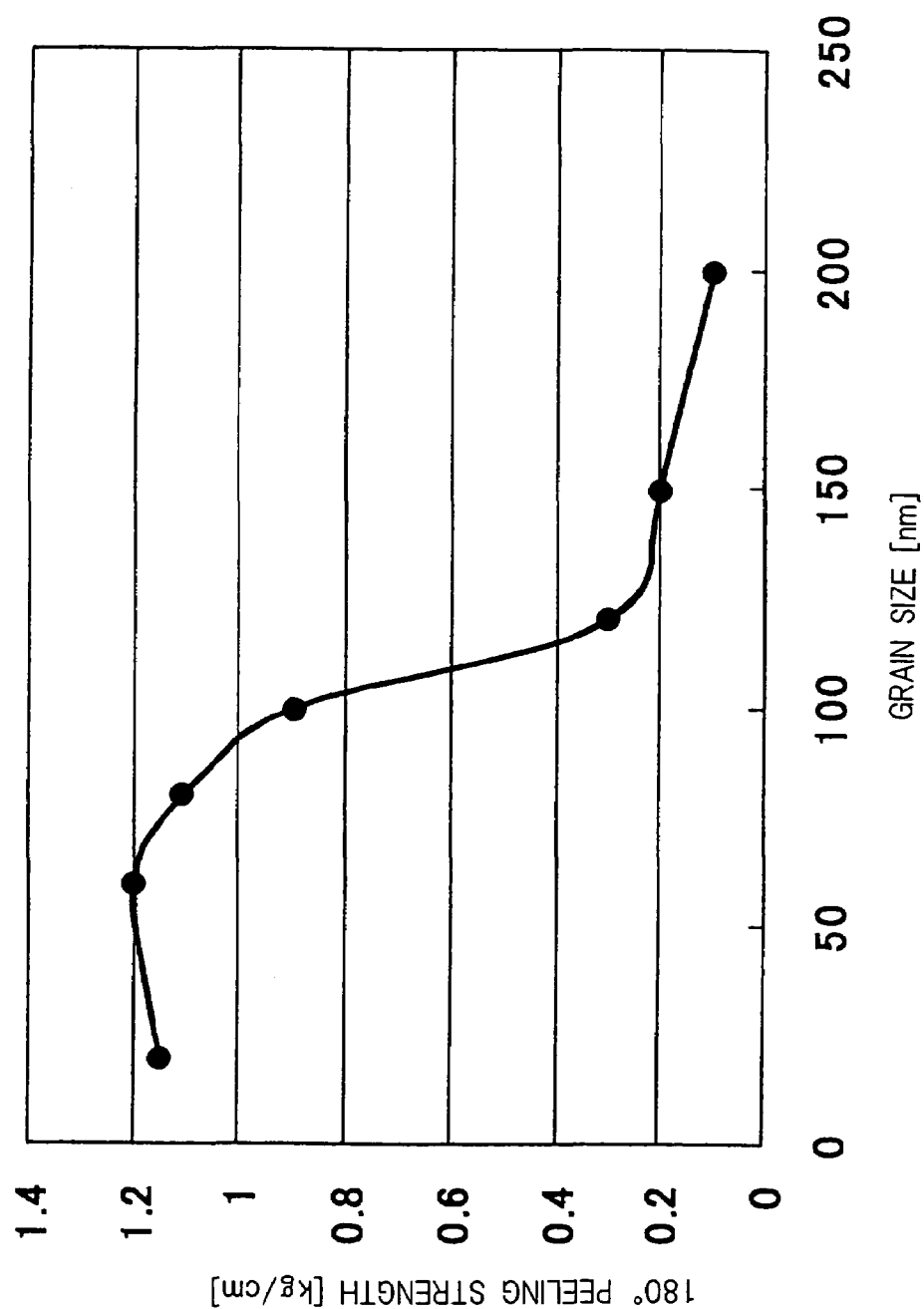
FIG. 6 is a graph showing the relationship between the grain size of the surface layer of the copper thin film and the 180° peeling strength in the flexible printed circuit board in accordance with the present invention.

FIG. 6 is a graph showing the relationship between the grain size [nm] (the grain size designated by reference numeral 6 in FIG. 1, for example) of the short axis of the crystal grain 5 and the 180° peeling strength [kg/cm] in conformity with JIS C6481 (180 degrees peeling).

In the 180° peeling strength test, flexible printed circuit boards having variously different grain sizes were produced by the production method in accordance with the present invention by changing the film-forming conditions of the surface layer 4 of the copper thin film, and the 180° peeling strength test was carried out in a state wherein the flexible printed circuit boards were coated with electroplated copper having a thickness of 20 μm.

As shown in FIG. 6, the peeling strength tends to increase as the grain size of the crystal grain 5 decreases. In addition, the peeling strength reaches 1 kg/cm or more at a grain size of approximately 80 nm; when the grain size is decreased further, the peeling strength increases gradually and tends to saturate. However, at a grain size of 20 nm, it is necessary to reduce the film-forming speed during the film-forming of the bottom layer 3 so that a spherical polycrystalline structure having a diameter of grain size of 20 nm or less is formed; this lowers productivity, thereby being undesirable.

When the flexible printed circuit board produced by the production method in accordance with the present invention was observed with a transmission electron microscope, as shown in the schematic cross-sectional view of FIG. 1, the copper thin film made of the copper or the alloy containing primarily copper and formed on the plastic film substrate 1 has a structure with at least two layers. The bottom layer 3 of the copper thin film, making contact with the surface of the plastic film substrate 1, has an aggregate structure of the spherical polycrystals 2, and the surface layer 4 of the copper thin film, formed on the bottom layer 3, is composed of the aggregate of the crystal grains 5 having a columnar structure. In the case when the diameter of the crystal grains of the bottom layer 3 is smaller than the grain size 6 of the crystal grains 5, having a columnar structure, of the surface layer 4, the 180° peeling strength increases; it is preferable that the copper thin film of the bottom layer 3 is the aggregate of the spherical polycrystals 2. The inventors have confirmed by experiment that the 180° peeling strength of this copper thin film satisfies the value of 1 kg/cm when the diameter of the spherical polycrystals 2 of the bottom layer 3 is 10 nm to 80 nm.

Figure 7:
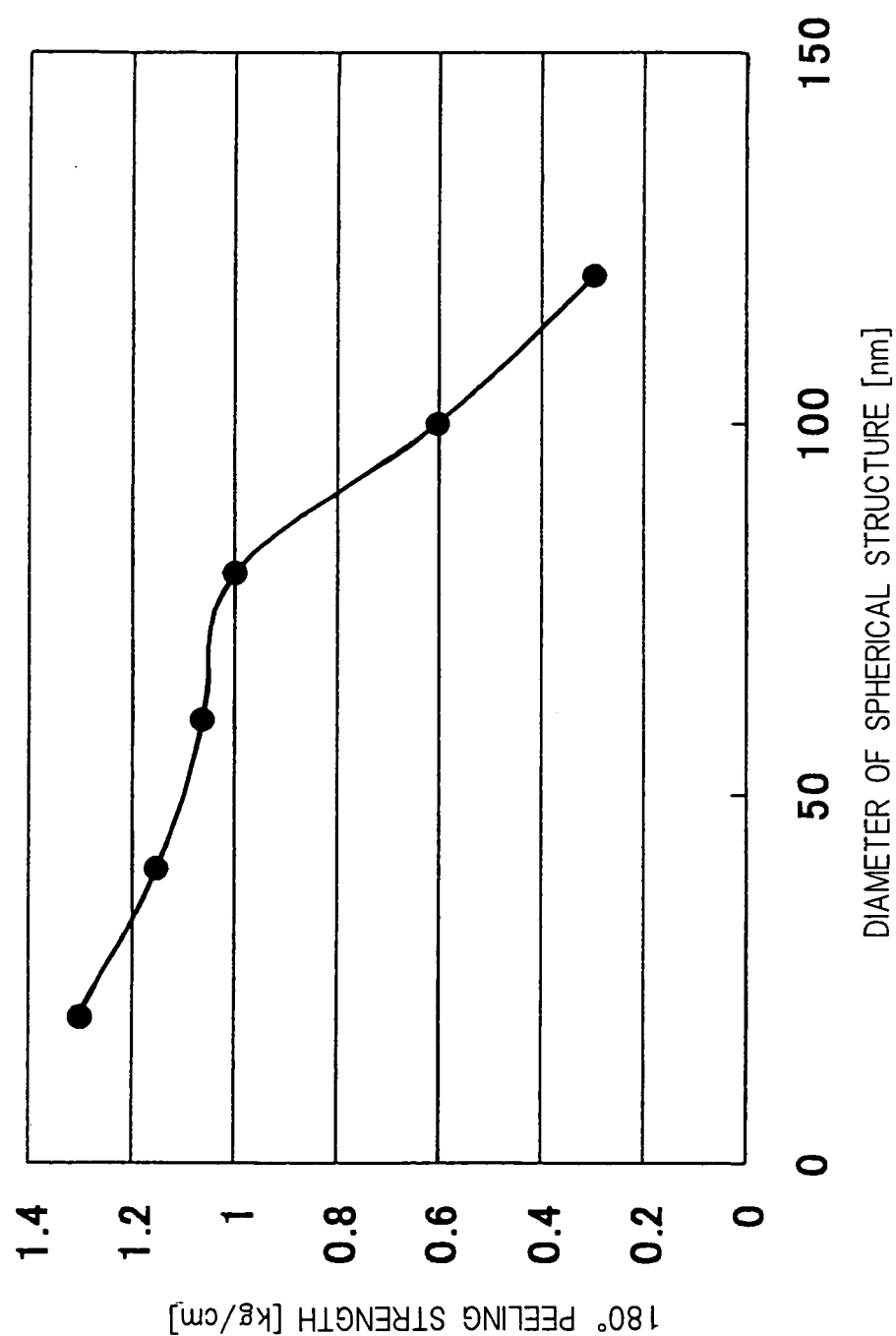
FIG. 7 is a graph showing the relationship between the diameter of the spherical polycrystals of the bottom layer of the copper thin film and the 180° peeling strength in the flexible printed circuit board in accordance with the present invention.

FIG. 7 is a graph showing the relationship between the diameter [nm] of the spherical polycrystals 2 constituting the bottom layer 3 and the 180° peeling strength [kg/cm] of the copper thin film. In this experiment, the production was carried out under all the same conditions except for the film-forming conditions of the bottom layer 3. In addition, the total film thickness of the copper thin films of the bottom layer 3 and the surface layer 4 was approximately 300 nm. Just as in the case of the experiment, the results of which are shown in the above-mentioned FIG. 6, a 180° peeling strength test was carried out in a state wherein the 300 nm copper thin film was coated with electroplated copper having a thickness of approximately 20 μm.

As shown in FIG. 7, the peeling strength is improved as the diameter of the spherical polycrystals 2 constituting the bottom layer 3 becomes smaller. The reason why the peeling strength is improved as the diameter of the spherical polycrystals 2 becomes smaller as described above is interpreted that the density of the spherical polycrystals 2 rises and the mutual contact areas increase as the diameter of the spherical polycrystals 2 in the spherical polycrystalline structure decreases, whereby the peeling strength is improved. This coincides with the effect of the increase in the density of the functional groups described above.

Figure 8:
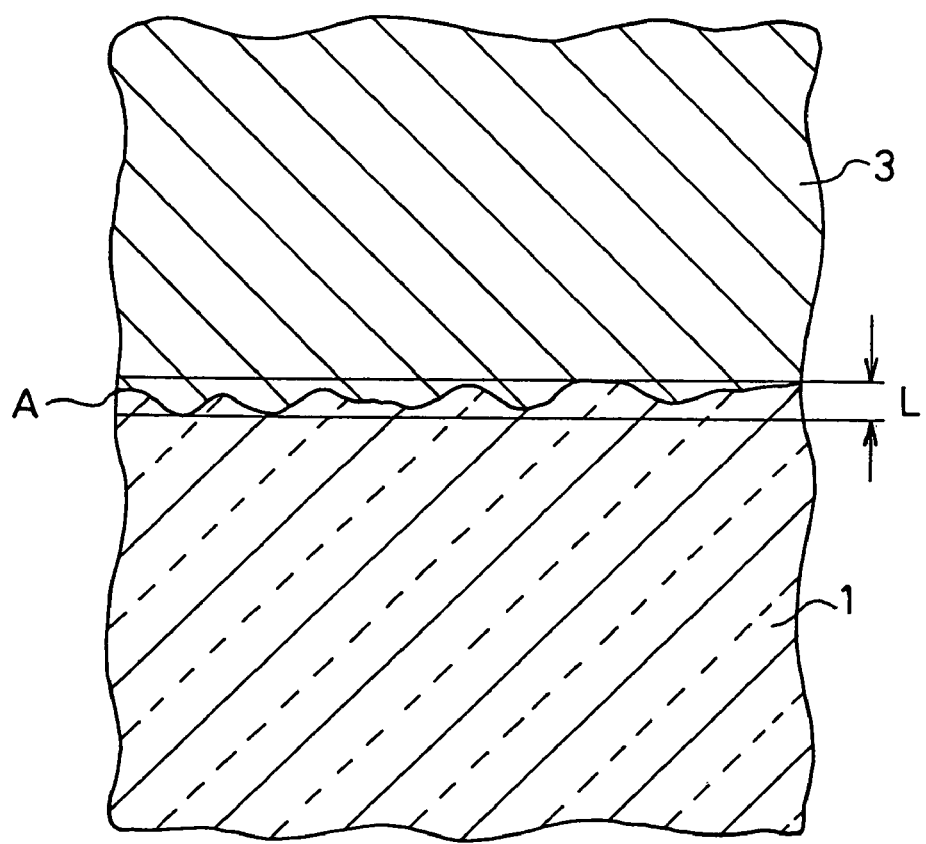
FIG. 8 is a magnified cross-sectional view showing the irregularity of the boundary face between the bottom layer 3 of the copper thin film and the plastic film 1 of a polyimide film.

Furthermore, the inventors have confirmed by experiment that the fluctuation width (peak to peak) of the irregular face on the boundary face between the bottom layer 3 and the plastic film substrate 1 is preferably 0.5 nm to 10 nm. FIG. 8 is a magnified cross-sectional view showing the irregularity of the boundary face A between the bottom layer 3 of the copper thin film and the plastic film substrate 1 of the polyimide film. In FIG. 8, the length designated by reference letter "L" is the fluctuation width of the irregular face on the boundary face A. In the experiment by the inventors, the fluctuation width L was 5 nm or less. The irregularity of the plastic film substrate 1 obtained by the present invention has a fluctuation width of 5 nm or less and is thus nearly flat. Therefore, the polyimide film formed by the present invention has scarce light scattering and is transparent; hence, in a chip on film being used as an application embodiment of the present invention, during die bonding when integrated circuits (ICs) are mounted, an effect wherein the electrode positions (pad positions) of the integrated circuits can be seen through from the back side of the plastic film substrate 1 is obtained. Therefore, the present invention can improve the accuracy of position alignment of the fine wiring lines on the polyimide film with the electrodes of the integrated circuits, whereby the present invention is useful as a film substrate for use in very fine liquid crystal drivers in particular.

Figure 9:
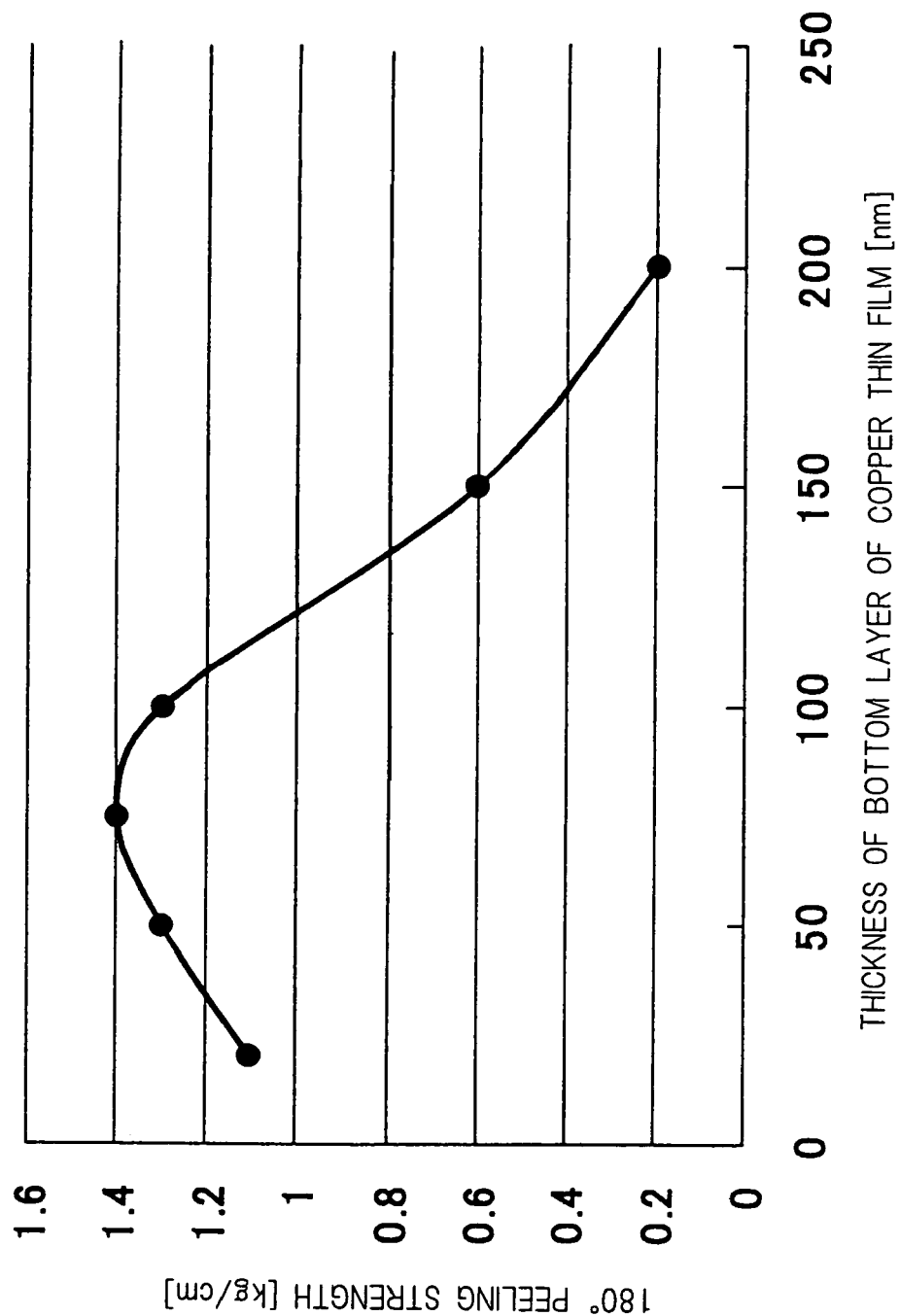
FIG. 9 is a graph showing the relationship between the film thickness of the bottom layer of the copper thin film and the 180° peeling strength in the flexible printed circuit board in accordance with the present invention.

In addition, the inventors have found by experiment that the 180° peeling strength satisfies the value of 1 kg/cm when the film thickness of the bottom layer 3 of the copper thin film is 10 nm to 100 nm. In this experiment, the 180° peeling strength experiment was carried out in a state wherein a coating of electroplated copper having a thickness of 20 μm was provided, just as in the case of the aforementioned experiments. FIG. 9 shows the results of the experiment conducted at this time and is a graph showing the relationship between the film thickness [nm] of the bottom layer 3 and the 180° peeling strength [kg/cm]. The production conditions were all the same except for the film thickness of the bottom layer 3. The total film thickness of the copper thin films of the bottom layer 3 and the surface layer 4 was approximately 300 nm.

As shown in FIG. 9, the 180° peeling strength is less than 1 kg/cm when the film thickness of the bottom layer 3 is 100 nm or more. This is interpreted that when the bottom layer 3 is 100 nm or more, the crystal grains 5, having the columnar structure, of the surface layer 4 cannot grow sufficiently and polycrystalline layers are present among the crystal grains 5. The flexible printed circuit board having the bottom layer 3 of 100 nm or more in thickness has a problem of degradation in chemical resistance.

With the present invention, it is preferable in productivity that the total film thickness of the copper thin films composed of the copper or the alloy containing primarily copper and formed on the plastic film substrate is 100 nm to 500 nm. If the total film thickness of the copper thin films is 100 nm or less, the growth of the subsequent copper plating is apt to fluctuate; if the thickness is more than 500 nm, the productivity lowers, resulting in raising the cost of the flexible printed circuit board.

EMBODIMENTS

Next, specific examples of the method for producing the flexible printed circuit board in accordance with the present invention will be shown, and the results obtained by observing the characteristics of the flexible printed circuit board produced by the method will be described.

Embodiment 1

In a film-forming apparatus in accordance with Embodiment 1 of the method for producing the flexible printed circuit board in accordance with the present invention, high-frequency power from a high-frequency oscillator is applied to a conductive substrate holder for holding a plastic film substrate, and glow discharge is generated, whereby the plastic film substrate subsequently becomes the negative electrode of the glow discharge. During this glow discharge, vaporized metal is excited or dissociated or ionized, and vacuum-evaporated on the substrate. The film-forming apparatus for use in Embodiment 1, into which an inert gas, such as argon, or a nitrogen gas is introduced, is used under reduced pressure.

Figure 10:
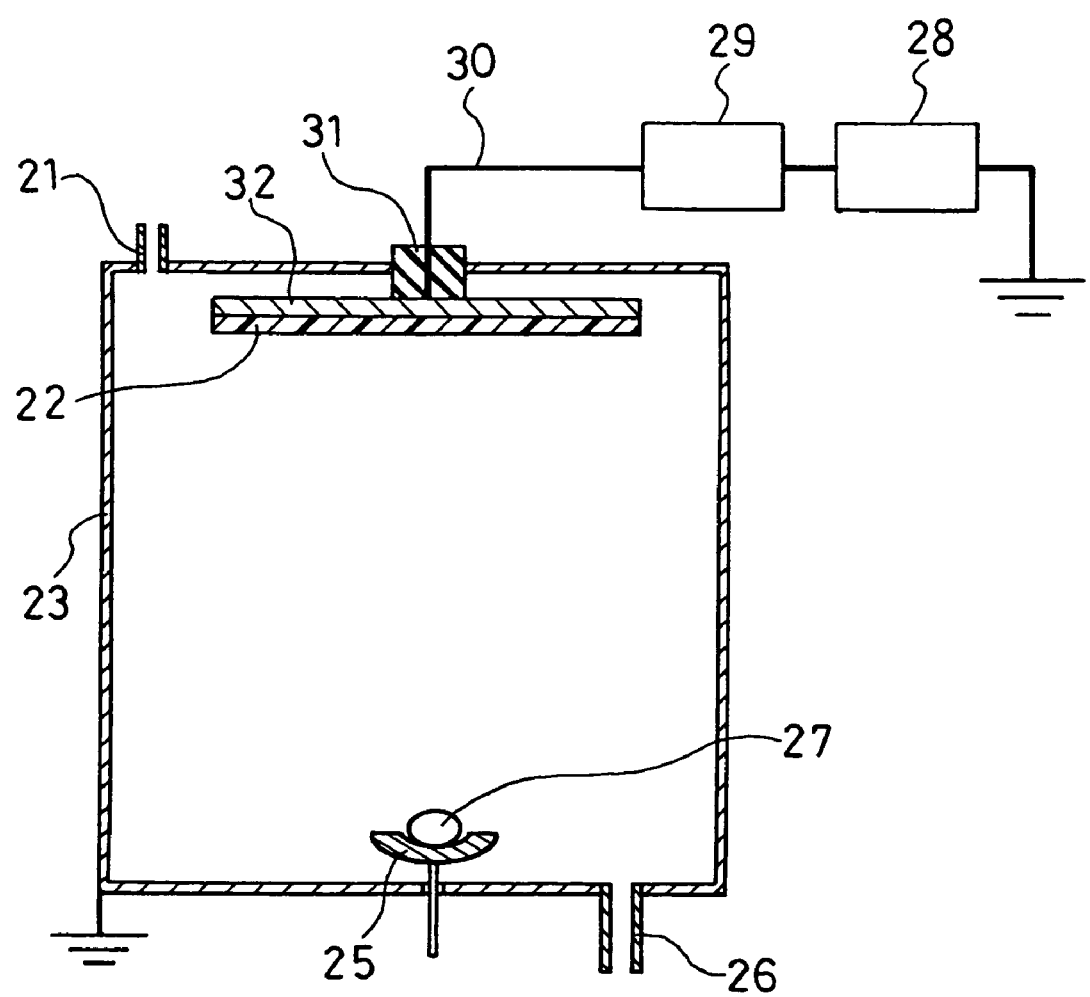
FIG. 10 is a cross-sectional view showing the schematic configuration of a film-forming apparatus for use in Embodiment 1.

FIG. 10 is a cross-sectional view showing the schematic configuration of the film-forming apparatus for use in Embodiment 1. In FIG. 10, a tungsten board 25 serving as an evaporation source and a conductive substrate holder 32 serving as a negative electrode are provided at predetermined positions inside a chamber 23. This conductive substrate holder 32 is configured so as to be able to hold a plastic film substrate 22 serving as a substance to be subject to evaporation. A high-frequency introduction cable 30 for inputting high-frequency power from a high-frequency oscillator 28 is connected to the conductive substrate holder 32 via a stable discharging circuit 29. The high-frequency introduction cable 30 is electrically insulated and supported by an insulating support section 31 in the chamber 23. In the chamber 23, a capacitor is subsequently formed between the housing of the film-forming apparatus and the high-frequency introduction cable 30 and the insulating support section 31, and this capacitor greatly contributes to the stabilization of the glow discharge. As shown in FIG. 10, a gas introduction port 21 and an exhaust port 26 are formed in the chamber 23, and the interior of the chamber 23 is configured so as to be set at a predetermined pressure by a predetermined gas.

Next, the method for producing the flexible printed circuit board using the film-forming apparatus configured as shown in FIG. 10 will be described.

First, the plastic film substrate 22 is placed on the conductive substrate holder 32, and vacuum pumping is carried out until an ultimate vacuum of $10^{-3}$ Pa or less is obtained. Next, dewatering processing is carried out until the partial pressure of moisture of the plastic film substrate 22 becomes $10^{-4}$ Pa or less.

Figure 11:
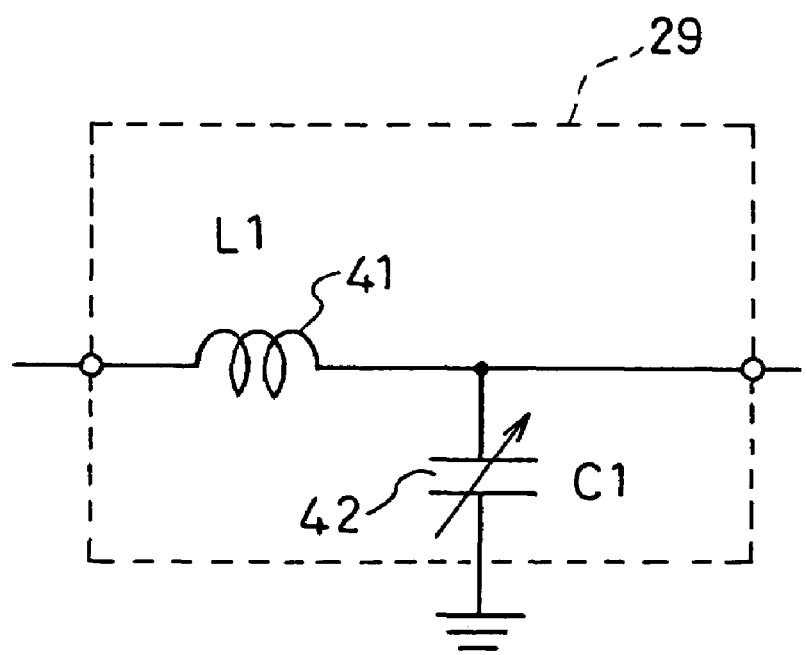
FIG. 11 is a circuit diagram showing a specific circuit configuration of a stable discharging circuit for use in Embodiment 1.

Next, in the film-forming apparatus, an argon gas containing nitrogen at a volumetric ratio of 5% is introduced into the vacuum from the gas introduction port 21, and the degree of vacuum is set at $1\times10^{-2}$ Pa. On the tungsten board 25, 99.99% copper 27 is placed and melted by heating. In the state wherein the copper 27 is melted, high-frequency power having a frequency of 13.56 MHz is applied to the plastic film substrate 22 by the stable discharging circuit 29 to generate glow discharge. A specific circuit configuration of the stable discharging circuit 29 being used at this time is shown in FIG. 11. As shown in FIG. 11, the stable discharging circuit 29 comprises a choke coil 41 and a variable capacitor 42. However, the stable discharging circuit for use in the present invention is not limited to have this kind of configuration, but it is possible to use a device being generally used as a high-frequency matching device.

In Embodiment 1, the power supplied by the stable discharging circuit 29 was 300 W. At this time, the negative bias voltage self-induced in the conductive substrate holder 32 in the vicinity of the plastic film substrate was 420 V.

In the environment having the above-mentioned conditions, the bottom layer 3 of a copper thin film making contact with the plastic film substrate 22 was first formed. The film-forming conditions at this time were that the film-forming speed was approximately 0.2 nm/sec measured using a film thickness monitor comprising a crystal oscillator and that copper having a purity of 99.99% was used. In the present invention, instead of pure copper, a copper alloy containing primarily copper can also be used. Even when an alloy containing iron, zinc, nickel, etc. is used instead of this copper alloy, the effects of the present invention are not affected.

The copper thin film serving as the bottom layer 3 is formed so as to have a film thickness of 60 nm by controlling the current flowing in the tungsten board 25. As a result, the bottom layer 3 of the copper thin film comprising spherical polycrystals having a diameter of 40 nm was formed.

Next, the surface layer 4 of a copper thin film was formed on the bottom layer 3. As the copper thin film serving as the surface layer 4, a thin film having a film thickness of 240 nm was formed at a film-forming speed of 5 nm/sec by increasing the current flowing in the tungsten board 25 of the film-forming apparatus. The film-forming speed of the surface layer 4 is not limited to the above-mentioned 5 nm/sec, but should only be set in the range of 0.5 nm/sec to 10 nm/sec dependent on the total film thickness. It has been confirmed that a copper thin film composed of columnar crystal grains having the crystal lattice plane index (111) can be formed in this range, The results obtained when the copper thin film obtained by the above-mentioned production method was observed in an X-ray diffraction pattern is shown in the graph of FIG. 3.

As shown in FIG. 3, the main peak (the peak indicated by reference letter A in FIG. 3) of the crystal lattice plane index (111) and the sub-peak (the peak indicated by reference letter B in FIG. 3) of (200) are found in the scanning range of 2θ equals to 42° to 53°. Furthermore, the intensity ratio (200)/(111) of the two peaks is approximately 10% or less. The plane of the crystal lattice plane index (111) is parallel to the surface of the plastic film substrate 22.

Moreover, when the cross-section of the flexible printed circuit board obtained by the above-mentioned production method was observed with a transmission electron microscope of a magnification of 1,220,000×, it was found that the circuit board had the structure schematically shown in FIG. 1 and that the crystal grains of its surface layer 4 are columnar crystals, the grain size of the short axis of the grain being approximately 60 nm.

The flexible printed circuit board obtained by the above-mentioned production method in accordance with Embodiment 1 of the present invention was coated with electroplated copper having a thickness of approximately 20 μm, and a 180° peeling test (normal peeling test) was conducted in conformity with JIS C6481 (180 degrees peeling). As a result, a 180° peeling strength of approximately 1.2 kg/cm was obtained. Furthermore, after this flexible printed circuit board was left at rest for 24 hours in a supersaturated steam autoclave at an ambient temperature of 121° and a pressure of 2 kg/cm², a 180° peeling test was conducted in conformity with JIS C6481 (180 degrees peeling). As a result, a 180° peeling strength of 1 kg/cm was obtained.

Still further, the flexible printed circuit board produced in accordance with Embodiment 1 was coated with electroplated copper having a thickness of approximately 20 μm, dipped in 2N aqueous hydrochloric acid for 5 minutes, washed with water and dried at an ambient temperature of 110° for 10 minutes, and then, a 180° peeling test was conducted also in conformity with JIS C6481 (180 degrees peeling). As a result, a 180° peeling strength of 1.1 kg/cm was obtained.

Embodiment 2

Next, in a film-forming apparatus in accordance with Embodiment 2 of the method for producing the flexible printed circuit board in accordance with the present invention, high-frequency power from a high-frequency oscillator is applied to a conductive substrate holder for holding a plastic film substrate, and glow discharge is generated, whereby the plastic film substrate subsequently becomes the negative electrode of the glow discharge. During this glow discharge, vaporized metal is excited or dissociated or ionized and vacuum-evaporated on the substrate. The film-forming apparatus for use in Embodiment 2, into which an inert gas, such as argon or a nitrogen gas is introduced, is used under reduced pressure. The film-forming apparatus of Embodiment 2 being the same as the film-forming apparatus of the above-mentioned Embodiment 1 was used.

First, the plastic film substrate is placed inside the film-forming apparatus, and vacuum pumping is carried out until an ultimate vacuum of $10^{-3}$ Pa or less is obtained. At this time, dewatering processing is carried out until the partial pressure of moisture of the plastic film substrate becomes $10^{-4}$ Pa or less.

Next, in the film-forming apparatus, a mixture gas containing nitrogen at a volumetric ratio of 99.99% is used, and 300 W high-frequency power having a frequency of 13.56 MHz is applied to the plastic film substrate by stable discharging means at a vacuum of $10^{-2}$ Pa. By the application of the 300 W high-frequency power in this way, the above-mentioned mixture gas is ionized, and glow discharge is generated for 5 minutes. At this time, the negative bias voltage self-induced in the conductive substrate holder in the vicinity of the plastic film substrate was 320 V.

As a result, the mixture gas containing nitrogen is excited or dissociated or ionized by the high-frequency power. The excited or dissociated or ionized mixture gas containing nitrogen cuts off hydrogen from the bond between carbon and hydrogen, carbon from the bond between carbon and carbon, and oxygen from the bond between carbon and oxygen on the surface of the plastic film substrate or in the vicinity of the surface by virtue of substitution reactions and abstraction reactions. Hence, in the plastic film substrate, nitrogen radicals and/or nitrogen ions enter the polymer by virtue of the substitution reactions and the abstraction reactions and are bound to the carbons cut off from the bonds, whereby cyano functional groups are generated. Therefore, with the production method in accordance with Embodiment 2, the cyano functional groups can be generated on the plastic film substrate at high density.

Then, in the film-forming apparatus, 99.99% copper is melted in vacuum. Next, introduction of a mixture gas containing argon at a volumetric ratio of 99.99% is selected by switching, and a vacuum of $1.0 \times 10^{-2}$ Pa is obtained. In this state, 300 W high-frequency power having a frequency of 13.56 MHz is applied to the plastic film substrate by the stable discharging means to generate glow discharge. At this time, the negative bias voltage self-induced in the vicinity of the plastic film substrate was 420 V. The bottom layer of the copper thin film is formed so as to have a film thickness of 60 nm by controlling the current of the evaporation source so that the speed of forming the copper film is in the range of 0.1 nm/sec to 0.5 nm/sec under glow discharge. Then, the surface layer of the copper thin film was formed so as to have a film thickness of 240 nm by increasing the current of the evaporation source so that the film-forming speed is in the range of 0.5 nm/sec to 10 nm/sec.

When the copper thin film obtained by the production method in accordance with Embodiment 2 as described above was observed in an X-ray diffraction pattern, the main peak of the crystal lattice plane index (111) and the sub-peak of (200) were found in the scanning range of 2θ equals to 42° to 53°, just as in the case of the above-mentioned Embodiment 1. The intensity ratio (200)/(111) of the two peaks was approximately 5%. The plane of the crystal lattice plane index (111) is parallel to the surface of the plastic film substrate. Furthermore, when the flexible printed circuit board produced by the production method in accordance with Embodiment 2 was observed with a transmission electron microscope of a magnification of 1,220,000×, it was found that the crystal grains of its surface layer are columnar crystals, the grain size of the short axis of the grain being approximately 40 nm.

The flexible printed circuit board produced in accordance with Embodiment 2 of the present invention was coated with electroplated copper having a thickness of approximately 20 μm, and a 180° peeling test was conducted in conformity with JIS C6481 (180 degrees peeling). As a result, a 180° peeling strength of approximately 1.1 kg/cm was obtained.

Pure water was dropped and a contact angle was measured with the CA-C FACE contact angle meter made by Kyowa Interface Science Co., Ltd. to examine the effect of the plasma processing on the plastic film substrate in the flexible printed circuit board produced in accordance with Embodiment 2. The contact angle of the polyimide film serving as the plastic film substrate subjected to the plasma processing in Embodiment 2 was 60 to 70 degrees, and the contact angle of an unprocessed polyimide film was 70 to 80 degrees. The surface tension of the polyimide film subjected to the plasma processing, obtained from these contact angles, was 52.5 dyne/cm to 47.0 dyne/cm depending on the contact angle, and was larger by approximately 5 dyne/cm than the surface tension of the unprocessed polyimide film. It has been found that a desired peeling strength value can be obtained by using the method for producing the flexible printed circuit board in accordance with the present invention, even in the case when the surface tension of the polyimide film subjected to the plasma processing has a small value. The specification of Japanese Patent No. 2135958 describes that a flexible printed circuit board is produced by a method wherein a polyimide film is subjected to the plasma processing so as to provide a surface tension of 58 dyne/cm or more. However, with the production method in accordance with the present invention, by subjecting the polyimide film to the plasma processing, it is not necessary to provide a surface tension of 58 dyne/cm or more; it has thus been found that even when the surface tension is not more than the value, a 180° peeling strength of 1 kg/cm or more can be obtained.

Similarly, the contact angle at the time when pure water was dropped on an unprocessed sample of a polytetrafluoroethylene PTFE resin, that is, a fluorocarbon resin, was 115°, and the surface tension was approximately 20 dyne/cm. The surface tension was increased by approximately 7 dyne/cm by subjecting this PTFE resin to the plasma processing in accordance with the present invention. In the production method in accordance with the present invention, by using the PTFE resin subjected to the plasma processing as the plastic film substrate, a flexible printed circuit board having a 180° peeling strength of 1 kg/cm or more was able to be provided, just as in the case of a polyimide film, even when the surface tension was considerably lower than that of the polyimide film.

COMPARATIVE EXAMPLE 1

Next, a method for producing a flexible printed circuit board produced as Comparative example 1 will be described.

In the film-forming apparatus, the flexible printed circuit board in accordance with Comparative example 1 was produced in the same conditions as those of the production method in accordance with the above-mentioned Embodiment 1, except that the partial pressure of moisture during the dewatering processing was set at $10^{-2}$ Pa. The film thickness of the bottom layer of the copper thin film was approximately 60 nm, and the film thickness of the surface layer of the copper thin film was approximately 240 nm. The flexible printed circuit board formed in this way was coated with electrolytically plated copper having a thickness of approximately 20 μm, and a 180° peeling test was conducted in conformity with JIS C6481 (180 degrees peeling). As a result, the 180° peeling strength was approximately 0.7 kg/cm.

Furthermore, the flexible printed circuit board formed as described above was coated with electroplated copper having a thickness of approximately 20 μm, dipped in 2N aqueous hydrochloric acid for 5 minutes, washed with water and dried at an ambient temperature of 110° for 10 minutes. After this 10-minute drying, a 180° peeling test was conducted also in conformity with JIS C6481 (180 degrees peeling). As a result, the 180° peeling strength was 0.3 kg/cm. As described above, the flexible printed circuit board in accordance with Comparative example 1 was significantly low in peeling strength.

Moreover, when the diameter of the grains of the surface layer of the copper thin film in accordance with Comparative example 1 was examined, the diameter of the grains was approximately 130 nm. Still further, when the cross-sectional structure of the flexible printed circuit board in accordance with Comparative example 1 was observed with a transmission electron microscope of a magnification of 190,000×, it was found that the diameter of spherical polycrystals constituting the bottom layer was approximately 120 nm and that amorphous copper was formed among the spherical polycrystals.

COMPARATIVE EXAMPLE 2

Next, a method for producing a flexible printed circuit board produced as Comparative example 2 will be described.

In the film-forming apparatus, the flexible printed circuit board in accordance with Comparative example 2 was produced by using argon having a volumetric ratio of 99.99% instead of a nitrogen gas when plasma processing was carried out and when the copper thin films were formed. In Comparative example 2, the other film-forming conditions were the same as those of the production method in accordance with the above-mentioned Embodiment 1. The film thickness of the bottom layer of the copper thin film was approximately 60 nm, and the film thickness of the surface layer of the copper thin film was approximately 240 nm. The flexible printed circuit board formed in this way was coated with electrolytically plated copper having a thickness of approximately 20 μm, and a 180° peeling test was conducted in conformity with JIS C6481 (180 degrees peeling). As a result, the 180° peeling strength was 0.3 kg/cm. When the diameter of the grains of the surface layer of the copper thin film in the flexible printed circuit board in accordance with Comparative example 2 was examined, the diameter of the grains was approximately 120 nm.

Still further, when the cross-sectional structure of the flexible printed circuit board in accordance with Comparative example 2 was observed with a transmission electron microscope of a magnification of 190,000×, the diameter of the spherical structure constituting the bottom layer was approximately 110 nm.

Figure 12:
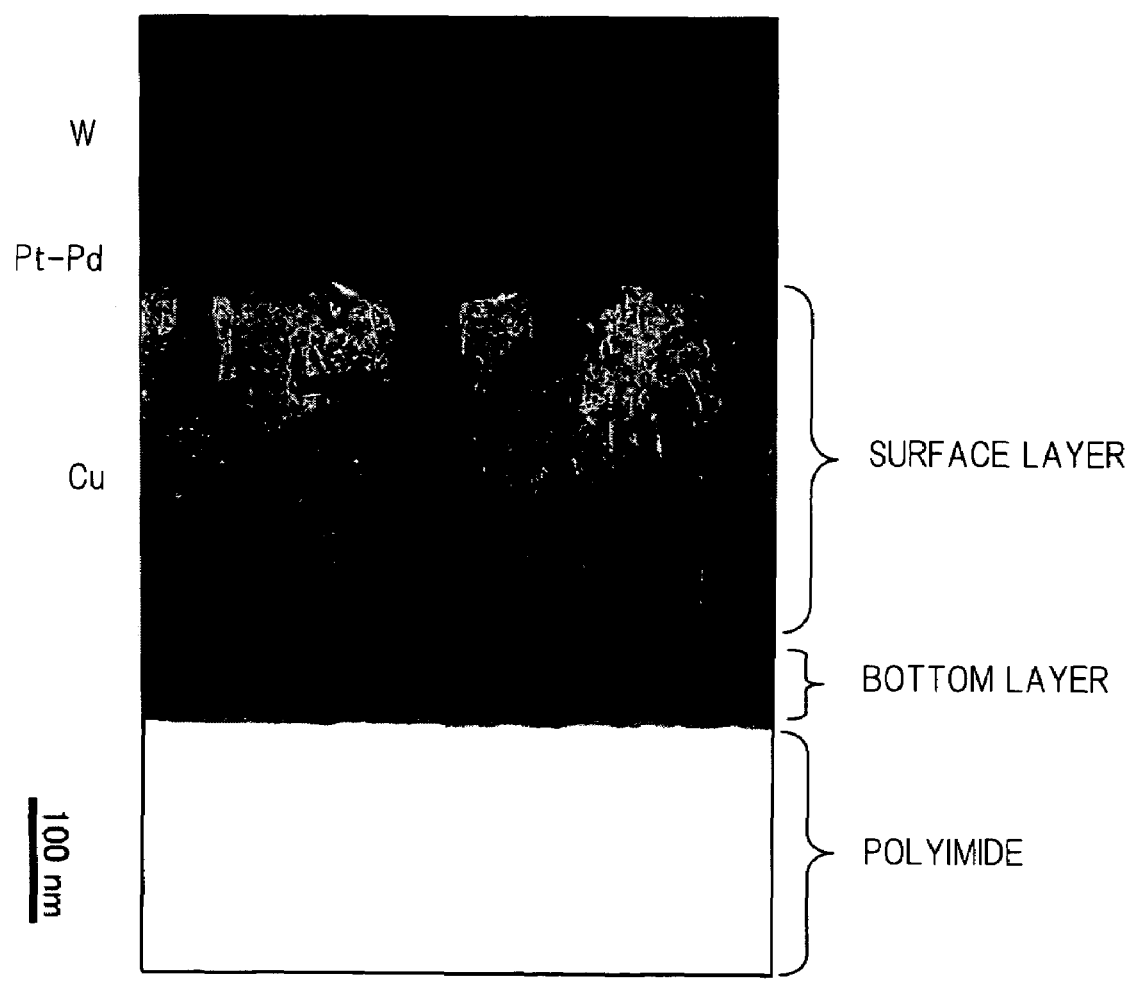
FIG. 12 is a micrograph obtained when the flexible printed circuit board produced by the production method in accordance with Embodiment 1 was photographed with a transmission electron microscope (TEM) at a magnification of 190,000×.

FIG. 12 is a micrograph obtained when the flexible printed circuit board produced by the production method in accordance with Embodiment 1 was photographed with a transmission electron microscope (TEM) at a magnification of 190,000×. At the time of transmission-type cross-sectional measurement, the surface layer of the copper thin film of this flexible printed circuit board is coated with a film of platinum-palladium (Pt—Pd) and tungsten (W), conductive metals, to protect the surface of the copper thin film to be tested. FIG. 13 is a micrograph obtained when the flexible printed circuit board produced by the production method in accordance with Comparative example 1 was photographed at a magnification of 190,000×. In the micrographs of FIG. 12 and FIG. 13, the plastic film substrate of the polyimide film is white-ground and its region is indicated with a line. When the micrograph of FIG. 12 is examined in detail, needle-shaped crystals are present in the boundary between the surface layer and the bottom layer, and the crystals of the bottom layer in FIG. 12 are smaller than those of the comparative example of FIG. 13. In other words, the diameter of the grains in the surface layer shown in FIG. 12 is small and the crystallization performance is high. In addition, the diameter of the spherical polycrystals of the bottom layer is made small. Hence, the peeling strength between the surface layer and the bottom layer is large. On the other hand, the diameter of the grains of the surface layer of Comparative example 1 shown in FIG. 13 is large and the crystallization performance is low. Furthermore, the diameter of the polycrystals of the bottom layer is large. Hence, the peeling strength between the surface layer and the bottom layer in Comparative example 1 is smaller than that of Embodiment 1.

The micrograph shown in part (a) of FIG. 14 is a photograph obtained when the copper thin film of the surface layer in the flexible printed circuit board produced by the production method in accordance with Embodiment 1 was photographed with a scanning electron microscope (SEM) at a magnification of 100,000×. The micrograph shown in part (b) of FIG. 14 is a photograph obtained when the copper thin film of the surface layer of the flexible printed circuit board produced by the production method in accordance with Comparative example 1 was photographed with a scanning electron microscope (SEM) at a magnification of 100,000×. As clarified by the micrographs of FIG. 14, the diameter of the grains of the copper thin film of the surface layer of Embodiment 1 in accordance with the production method of the present invention is made smaller than that of Comparative example 1.

Furthermore, the inventors have confirmed by experiment that the fluctuation width L (FIG. 8) of the irregular face on the boundary face between the bottom layer 3 and the plastic film substrate 1 is preferably 0.5 nm to 10 nm, and it is particularly preferable that the fluctuation width L is 5 nm or less.

As clarified by the detailed descriptions using the embodiments and the comparative examples, the present invention has the following effects.

With the present invention, it is possible to bond a copper thin film made of copper or an alloy containing primarily copper to a plastic film firmly and directly.

With the present invention, in a flexible printed circuit board in which a copper thin film made of copper or an alloy containing primarily copper is directly bonded with adhesive to at least one side of a plastic film, the interface structure between the plastic film and the copper thin film and the crystalline structure of a copper thin film to be grown subsequently are controlled by controlling the surface state of the plastic film substrate on which a film should be formed and by optimizing the film-forming conditions of the copper thin film, whereby it is possible to provide a flexible printed circuit board, at low cost, which has very high adhesion performance and on which very fine circuit patterns can be formed by etching.

The flexible printed circuit board in accordance with the present invention can be provided with very fine circuit patterns having very high adhesion performance by etching. In addition, with the method for producing the flexible printed circuit board in accordance with the present invention, it is possible to form very fine circuit patterns having very high adhesion performance by etching, and it is also possible to produce a flexible printed circuit board at low cost. Therefore, the flexible printed wiring board in accordance with the present invention can be utilized in all electronic fields, whereby highly versatile electric and electronic components can be provided. The present invention is applicable to circuit boards ranging from, for example, general flexible printed circuit boards to wiring boards absolutely requiring bonding, such as TAB (Tape Automated Bonding, COF (Chip on Film) and PGA (Package Gate Array).

Still further, the present invention can accomplish flexible printed circuit boards capable of providing high-density wiring boards, high-frequency circuit boards, electric and electronic components, such as flat electrodes, gas sensors and current collectors for fuel cells in this field.

Although the invention has been described in its preferred form with a certain degree of particularity, it is understood that the present disclosure of the preferred form has been changed in the details of construction and the combination and arrangement of parts may be resorted to without departing from the spirit and the scope of the invention as claimed.

INDUSTRIAL APPLICABILITY

The present invention relates to a flexible printed circuit board which has very high adhesion performance and on which very fine circuit patterns can be formed by etching, and to a method for producing the same, thereby being useful as flexible printed circuit boards for use in the electronic circuits of mobile phones, PDAs (personal digital assistants), notebook personal computers, digital still cameras, liquid crystal displays, etc., and also useful as a method for producing the same.

The invention claimed is:

1. A flexible printed circuit board having a copper thin film made of copper or an alloy containing primarily copper and directly formed on at least one side of a plastic film substrate, wherein said copper thin film has a two-layer structure comprising a surface layer having a crystalline structure and a bottom layer having a polycrystalline structure formed between said surface layer and said plastic film substrate, said copper thin film has an x-ray diffraction pattern in which an x-ray relative intensity ratio (200)/(111), that is a value obtained by dividing a peak intensity of the crystal lattice plane index (200) by a peak intensity of the crystal lattice plane index (111), is 0.1 or less, and said bottom layer is configured such that functional groups are generated on said plastic film substrate through plasma processing by glow discharge using a mixture gas containing nitrogen followed by evaporation to form copper metal or an alloy containing primarily copper on said plastic film substrate, wherein the metal or alloy bonds covalently to the functional groups of said plastic film substrate.

2. The flexible printed circuit board in accordance with claim 1, wherein said surface layer is composed of crystal grains having at least the crystal lattice plane index (111) and that said crystalline structure is a columnar structure.

3. The flexible printed circuit board in accordance with claim 1, wherein said surface layer is composed of columnar crystal grains having at least the crystal lattice plane index (111) and that said crystal grains are formed into a cylindrical shape, a polygonal columnar shape or a shape of a mixture of these.

4. The flexible printed circuit board in accordance with claim 1, wherein said surface layer is composed of columnar crystal grains having at least the crystal lattice plane index (111) and said crystal grains are formed into a needle shape so that the short-axis diameters thereof are gradually reduced toward the side of said bottom layer making contact with said plastic film substrate.

5. The flexible printed circuit board in accordance with claim 1, wherein the columnar crystal grains having the crystal lattice plane index (111) and constituting said surface layer have a plane of said crystal lattice plane index (111) to be arranged according to preferred orientation in parallel to the surface of said plastic film.

6. The flexible printed circuit board in accordance with claim 1, wherein said copper thin film has a film thickness of 100 nm to 500 nm.

7. The flexible printed circuit board in accordance with claim 1, wherein said plastic film substrate is made of at least one material selected from the group consisting of polyimide film, polytetrafluorethylene and liquid crystal polymer.

8. A flexible printed circuit board comprising a copper thin film made of copper or an alloy containing primarily copper directly formed on at least one side of a plastic film substrate, and copper formed on said copper thin film by the electrolytic plating method, wherein said copper thin film has a two-layer structure comprising a surface layer having a crystalline structure and a bottom layer having a polycrystalline structure formed between said surface layer and said plastic film substrate, said surface layer is composed of crystal grains having at least the crystal lattice plane index (111) and the grain size of the short axis of said crystal grains is 20 nm to 80 nm, and said bottom layer is configured such that functional groups are generated on said plastic film substrate through plasma processing by glow discharge using a mixture gas containing nitrogen followed by evaporation to form copper metal or an alloy containing primarily copper on said plastic film substrate, wherein the metal or alloy bonds covalently to the functional groups of said plastic film substrate.

9. The flexible printed circuit board in accordance with claim 1, wherein said bottom layer has a spherical structure.

10. The flexible printed circuit board in accordance with claim 9, wherein said bottom layer has a spherical structure having a diameter of 10 nm to 80 nm.

11. The flexible printed circuit board in accordance with claim 9, wherein said bottom layer has a film thickness of 10 nm to 100 nm.

12. A flexible printed circuit board comprising a copper thin film made of copper or an alloy containing primarily copper directly formed on at least one side of a plastic film substrate, and copper formed on said copper thin film by the electrolytic plating method, wherein said copper thin film has a two-layer structure comprising a surface layer having a columnar crystalline structure and a bottom layer having a spherical polycrystalline structure formed between said surface layer and said plastic film substrate, said bottom layer is configured such that functional groups are generated on said plastic film substrate through plasma processing by glow discharge using a mixture gas containing nitrogen followed by evaporation to form copper metal or an alloy containing primarily copper on said plastic film substrate, wherein the metal or alloy bonds covalently to the functional groups of said plastic film substrate, and the diameter of a crystal grain of the spherical crystalline structure of said bottom layer is made of smaller than the short-axis diameter of a crystal grain of the columnar polycrystalline structure of said surface layer.

13. The flexible printed circuit board in accordance with claim 12, wherein said surface layer is composed of crystal grains having the crystal lattice plane index (111).

14. The flexible printed circuit board in accordance with claim 12, wherein the grain size of the short axis of the crystal grains having the crystal lattice plane index (111) and constituting said surface layer is 20 nm to 80 nm.

15. The flexible printed circuit board in accordance with claim 12, wherein said surface layer is composed of crystal grains having at least the crystal lattice plane index (111) and said crystal grains are formed into a needle shape so that the short-axis diameter thereof is gradually reduced toward the side of said bottom layer making contact with said plastic film.

16. The flexible printed circuit board in accordance with claim 15, wherein said surface layer is formed into a cylindrical shape, a polygonal columnar shape or a shape of a mixture of these.

17. A flexible printed circuit board comprising a copper thin film made of copper or an alloy containing primarily copper directly formed on at least one side of a plastic film substrate, and copper formed on said copper thin film by the electrolytic plating method, wherein said copper thin film has a two-layer structure comprising a bottom layer making contact with said plastic film substrate and a surface layer formed on said bottom layer, said bottom layer is configured such that functional groups are generated on said plastic film substrate through plasma processing by glow discharge using a mixture gas containing nitrogen followed by evaporation to form copper metal or an alloy containing primarily copper on said plastic film substrate, wherein the metal or alloy bonds covalently to the functional groups of said plastic film substrate, and the fluctuation width of an irregular face on the boundary face between said plastic film substrate and said bottom layer is in the range of 0.5 nm to 10 nm.

18. The flexible printed circuit board in accordance with claim 17, wherein said bottom layer has polycrystals.

* * * * *